(12) United States Patent
Kim et al.

(10) Patent No.: US 9,008,147 B2
(45) Date of Patent: Apr. 14, 2015

(54) SILICON-BASED LENS SUPPORT STRUCTURE AND COOLING PACKAGE WITH PASSIVE ALIGNMENT FOR COMPACT HEAT-GENERATING DEVICES

(71) Applicants: Gerald Ho Kim, Carlsbad, CA (US); Jay Eunjae Kim, Issaquah, WA (US)

(72) Inventors: Gerald Ho Kim, Carlsbad, CA (US); Jay Eunjae Kim, Issaquah, WA (US)

( * ) Notice: Subject to any disclaimer, the term of this patent is extended or adjusted under 35 U.S.C. 154(b) by 0 days.

(21) Appl. No.: 13/888,153

(22) Filed: May 6, 2013

(65) Prior Publication Data
US 2014/0003056 A1 Jan. 2, 2014

Related U.S. Application Data

(63) Continuation-in-part of application No. 13/540,324, filed on Jul. 2, 2012, now Pat. No. 8,457,173.

(51) Int. Cl.
| | |
|---|---|
| *H01S 3/08* | (2006.01) |
| *F21V 29/00* | (2006.01) |
| *F28F 21/00* | (2006.01) |
| *F21V 5/04* | (2006.01) |
| *H01S 5/022* | (2006.01) |
| *H01S 5/40* | (2006.01) |
| *H01S 5/024* | (2006.01) |

(52) U.S. Cl.
CPC ............... *F21V 29/22* (2013.01); *F28F 21/00* (2013.01); *F21V 5/043* (2013.01); *H01S 5/02252* (2013.01); *H01S 5/02288* (2013.01); *H01S 5/4031* (2013.01); *H01S 5/02236* (2013.01); *H01S 5/02469* (2013.01)

(58) Field of Classification Search
CPC ............ H01S 5/02288; H01S 5/02236; H01S 5/02252; H01S 5/4031; H01S 5/02469; H01S 5/005; H01S 5/02476; H01S 5/024; H01S 5/02272; H01S 5/021; H01S 5/18; H01S 5/183
USPC .......... 372/33–36, 50.12, 50.23, 107; 257/81, 257/88, 89, 432; 359/618–621, 341.1, 359/337.4, 342.2, 333; 361/703–710; 165/80.3, 185
See application file for complete search history.

(56) References Cited

U.S. PATENT DOCUMENTS

| | | | | |
|---|---|---|---|---|
| 4,897,711 | A * | 1/1990 | Blonder et al. ................. | 257/48 |
| 5,181,216 | A * | 1/1993 | Ackerman et al. .............. | 372/36 |
| 5,828,683 | A * | 10/1998 | Freitas ............................ | 372/36 |
| 6,295,307 | B1 * | 9/2001 | Hoden et al. .................... | 372/36 |
| 6,396,857 | B1 * | 5/2002 | Labranche et al. ............. | 372/36 |
| 6,647,035 | B1 * | 11/2003 | Freitas et al. ................... | 372/36 |
| 7,864,825 | B2 * | 1/2011 | Thiagarajan et al. .......... | 372/36 |
| 8,238,401 | B2 * | 8/2012 | Kim ............................... | 372/107 |
| 8,457,173 | B2 * | 6/2013 | Kim ............................... | 372/107 |
| 2004/0109666 | A1 * | 6/2004 | Kim, II ......................... | 385/147 |
| 2005/0201063 | A1 * | 9/2005 | Lee et al. ....................... | 361/715 |

(Continued)

*Primary Examiner* — Colleen A Matthews
*Assistant Examiner* — Delma R Forde

(57) ABSTRACT

A silicon-based thermal energy transfer apparatus that aids dissipation of thermal energy from a heat-generating device, such as an edge-emitting laser diode, is provided. In one aspect, the apparatus comprises a base portion and a support portion. The base portion is made of silicon and includes a first primary surface. The first primary surface includes at least first and second V-notch grooves thereon. The support portion is made of silicon and includes at least first and second edges that are interlockingly received in the first and second V-notch grooves when the support portion is mounted on the base portion.

14 Claims, 26 Drawing Sheets

(56) References Cited

U.S. PATENT DOCUMENTS

| | | |
|---|---|---|
| 2005/0238312 A1* | 10/2005 | Meder et al. .................. 385/137 |
| 2007/0097491 A1* | 5/2007 | Jenkins et al. ............. 359/337.4 |
| 2010/0000718 A1* | 1/2010 | Kim ......................... 165/104.19 |
| 2012/0080612 A1* | 4/2012 | Grego et al. ............... 250/458.1 |
| 2013/0270255 A1* | 10/2013 | Kim et al. .................... 219/494 |
| 2014/0003056 A1* | 1/2014 | Kim et al. ..................... 362/259 |
| 2014/0131011 A1* | 5/2014 | Kim ......................... 165/104.21 |
| 2014/0158329 A1* | 6/2014 | Kim ............................. 165/168 |

\* cited by examiner

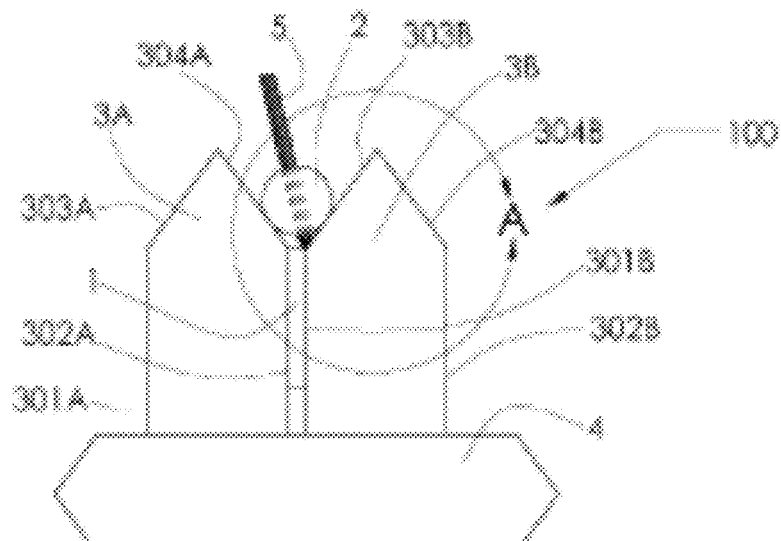
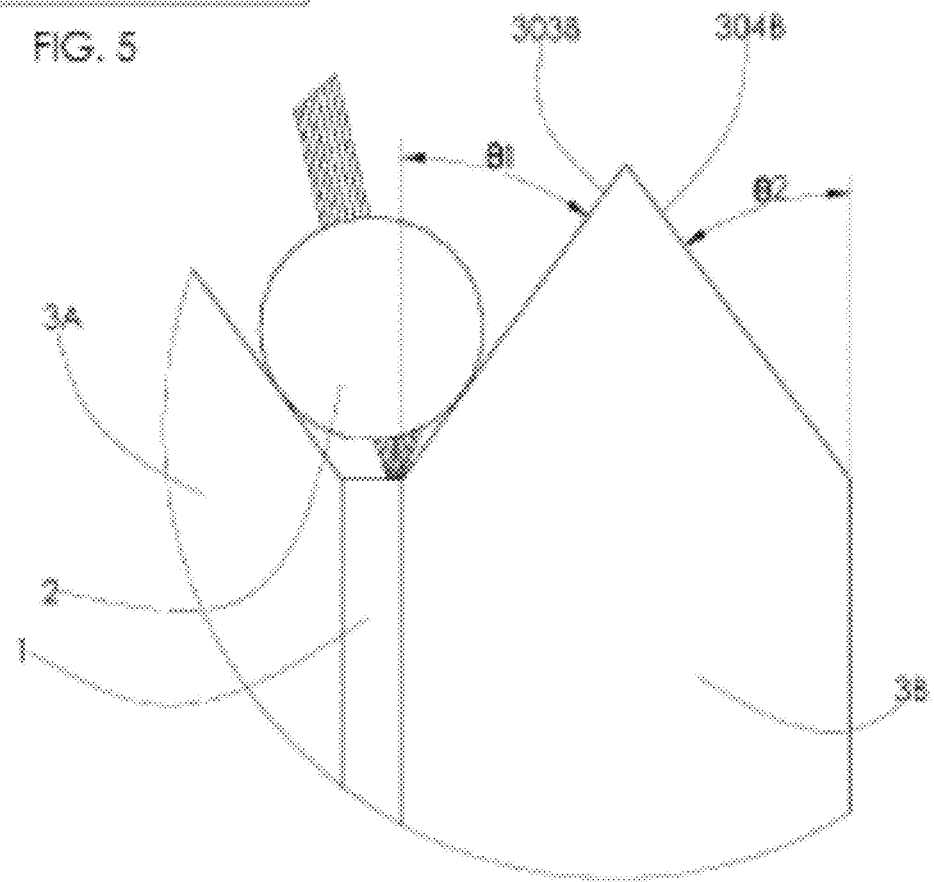

SILICON-BASED LENS SUPPORT STRUCTURE AND COOLING PACKAGE WITH PASSIVE ALIGNMENT FOR COMPACT HEAT-GENERATING DEVICES

CROSS-REFERENCE TO RELATED APPLICATIONS

This application is a continuation-in-part of U.S. patent application Ser. No. 13/540,324, filed Jul. 2, 2012, which is a continuation of U.S. patent application Ser. No. 12/546,287, filed Aug. 24, 2009 and issued as U.S. Pat. No. 8,238,401 on Aug. 7, 2012, which claims the priority benefit of U.S. patent application Ser. No. 61/189,971, filed Aug. 25, 2008. The aforementioned applications are herein incorporated by reference in their entirety.

BACKGROUND

1. Technical Field

The present disclosure generally relates to the field of collimation of emitted light as well as transfer of thermal energy. More particularly, the present disclosure is related to a lens support structure and the removal of thermal energy from a compact light-emitting device supported by the lens support structure.

2. Description of the Related Art

High-power direct diode lasers are gaining popularity in applications such as heat treating and cutting in the automobile and material processing industries. To heat or cut a material, the radiance of the diode laser has to be high enough to process the material effectively. Manufacturers of diode lasers have developed single-stack and multi-stack diode lasers with an attached collimating lens to collimate light emitted from the fast-axis of diode lasers. Fast-axis collimation is possible to within a few milli-radians of divergence of the laser beam when a collimating lens is used. A collimating lens is typically a rod lens or high numerical aperture cylindrical lens, and each diode laser typically has a collimating lens attached to the fast-axis, which is placed about a few tens or hundreds of microns in front of a facet of the diode laser.

To maintain a perfectly parallel beam of light, the collimating lens has to be placed within a few tens or hundreds of microns from the diode laser facet, with some variational dependence on the optical working distance of the collimating lens. This requires alignment of the collimating lens with the diode laser. It is not easy to passively align the collimating lens to perfectly collimate the laser beam, and many hours of alignment and special tools are usually required to assemble a diode laser package that includes one or more diode laser and the respective one or more collimating lens. Alternatively, alignment of the collimating lens can be provided via active alignment, in which alignment is provided on a real-time basis. However, active alignment can be particularly difficult for a high-power diode stack due to the large number of closely packaged diode lasers.

In the case of a multi-stack diode laser, each individual diode laser has to be collimated and the respective collimating lens is attached to the diode laser package structure. In aligning each collimating lens, the diode laser is running at the operating current and the collimating lens is aligned with a tooling setup that allows for movement of the collimating lens in a four- or five-axis controlled mechanical stage. After the alignment, the collimating lens is attached to the frame of the diode laser by, for example, UV-curing epoxy or a soldering process. However, failure of diode laser alignment is not uncommon. Typically, alignment of the diode laser fails due to weak bonding of the epoxy or degradation of the epoxy joint caused by thermal cycles of the diode laser.

There is, therefore, a need for a novel mechanical structure to align the collimating lens to provide optimal collimation and to hold the collimating lens in place to withstand many thermal cycles of the diode laser.

Furthermore, compact light-emitting devices, such as light-emitting diodes (LEDs), laser diodes, vertical cavity surface-emitting lasers (VCSELs) and the like, generate thermal energy, or heat, when in operation and hence are heat-generating devices themselves (hereinafter referred to as "compact heat-generating devices" and "heat-generating devices"). Regardless of which type of heat-generating device the case may be, heat generated by a compact heat-generating device must be removed or dissipated from the compact heat-generating device in order to achieve optimum performance of the compact heat-generating device and keep its temperature within a safe operating range. With the form factor of compact heat-generating devices and the applications they are implemented in becoming ever smaller, resulting in high heat density, it is imperative to effectively dissipate the high-density heat generated in an area of small footprint to ensure safe and optimum operation of compact heat-generating devices operating under such conditions.

Many metal-based water-cooled and air-cooled cooling packages have been developed for use in compact packages to dissipate heat generated by the various types of compact heat-generating devices mentioned above. For instance, heat exchangers and heat pipes made of a metallic material with high thermal conductivity, such as copper, silver, aluminum or iron, are commercially available. However, most metal-based heat exchangers and heat pipes experience issues of oxidation, corrosion and/or crystallization after long periods of operation. Such fouling factors significantly reduce the heat transfer efficiency of metal-based heat exchangers and heat pipes. Other problems associated with the use of metal-based cooling packages include, for example, issues with overall compactness of the package, corrosion of the metallic material in water-cooled applications, difficulty in manufacturing, and so on. With increasing demand for high power density in small form factor, there is a need for a compact cooling package for compact heat-generating devices with fewer or none of the aforementioned issues.

SUMMARY

Various embodiments of a silicon-based thermal energy transfer apparatus that aids dissipation of thermal energy from a heat-generating device are provided.

In one aspect, a silicon-based thermal energy transfer apparatus that aids dissipation of thermal energy from a heat-generating device may include a base portion and a support portion. The base portion may be made of silicon and may include a first primary surface. The first primary surface may include at least first and second V-notch grooves thereon. The support portion may be made of silicon and may include at least first and second edges that are interlockingly received in the first and second V-notch grooves when the support portion is mounted on the base portion.

In at least some embodiments, the support portion may include first and second fin portions made of silicon and extending longitudinally from the first primary surface of the base portion. The first fin portion may include a first primary end received by the base portion and a second primary end opposite the first primary end of the first fin portion. The first fin portion may further include a first primary surface facing the second fin portion and a second primary surface opposite the first primary surface of the first fin portion. The first and second primary surfaces of the first fin portion may extend between the first and second primary ends of the first fin portion. The second fin portion may include a first primary end received by the base portion and a second primary end opposite the first primary end of the second fin portion. The second fin portion may further include a first primary surface facing the first fin portion and a second primary surface opposite the first primary surface of the second fin portion. The first and second primary surfaces of the second fin portion may extend between the first and second primary ends of the second fin portion. The first primary surface of the first fin portion may include a recess configured to receive the heat-generating device. The recess may include a primary recess surface that is generally parallel to the first primary surface of the first fin portion. The first fin portion may further include an opening between the recess and the second primary end of the first fin portion such that the primary recess surface extends to the second primary end of the first fin portion.

In at least some embodiments, a dimension of the opening that is horizontal with respect to the base portion may be less than a dimension of the recess that is horizontal with respect to the base portion.

In at least some embodiments, the recess may be sized and shaped to have at least two dimensions of the recess along the primary recess surface matching corresponding dimensions of the heat-generating device so that the heat-generating device is tightly received in the recess when the heat-generating device is received in the recess.

In at least some embodiments, the recess may be relatively closer to the first primary end of the first fin portion than to the second primary end of the first fin portion.

In at least some embodiments, the first fin portion may be taller than the second fin portion with respect to the first primary surface of the base portion when the first primary end of the first fin portion and the first primary end of the second fin portion are received by the base portion.

In at least some embodiments, the first and second fin portions may be in contact when the first and second fin portions are received by the base portion.

In at least some embodiments, at least one of the base portion and the support portion may be made of single-crystal silicon.

In at least some embodiments, the apparatus may further include the heat-generating device received in the recess and between the first fin portion and the second fin portion with at least a portion of an edge along a primary surface of the heat-generating device that is in contact with the first primary surface of the second fin portion exposed by the opening of the first fin portion.

In at least some embodiments, the heat-generating device may include an edge-emitting laser diode with a first primary side that has a light-emitting edge adjacent and in contact with the first primary surface of the second fin portion when the heat-generating device is received in the recess.

In another aspect, a silicon-based thermal energy transfer apparatus that aids dissipation of thermal energy from an edge-emitting laser diode may include a silicon-based base portion and a silicon-based support portion. The silicon-based base portion may include a first primary surface. The silicon-based support structure may include a mounting end and a distal end opposite the mounting end with the mounting end received by the base portion such that the support structure extends from the first primary surface of the base portion, the support structure having a recess defined therein to receive the edge-emitting laser diode. The base portion may include first and second grooves each having a generally V-shaped longitudinal cross section such that the first and second fin portions are interlockingly received in the first and second grooves respectively. The first primary end of the first fin portion may be generally V-shaped and received in the first groove. The first primary end of the second fin portion may be generally V-shaped and received in the second groove.

In at least some embodiments, the recess may be sized and shaped so that the edge-emitting laser diode is tightly received in the recess when the edge-emitting laser diode is received in the recess.

In at least some embodiments, the support structure may include first and second fin portions made of silicon and extending longitudinally from the first primary surface of the base portion. The first fin portion may include a first primary end received by the base portion and a second primary end opposite the first primary end of the first fin portion. The first fin portion may further include a first primary surface facing the second fin portion and a second primary surface opposite the first primary surface of the first fin portion. The first and second primary surfaces of the first fin portion may extend between the first and second primary ends of the first fin portion. The second fin portion may include a first primary end received by the base portion and a second primary end opposite the first primary end of the second fin portion. The second fin portion may further include a first primary surface facing the first fin portion and a second primary surface opposite the first primary surface of the second fin portion. The first and second primary surfaces of the second fin portion may extend between the first and second primary ends of the second fin portion. The first primary surface of the first fin portion may include the recess configured to receive the edge-emitting laser diode. The recess may include a primary recess surface that is generally parallel to the first primary surface of the first fin portion. The first fin portion may further include an opening between the recess and the second primary end of the first fin portion such that the primary recess surface extends to the second primary end of the first fin portion.

In at least some embodiments, the support structure may further include a slit connecting the distal end and the recess to expose at least a portion of a light-emitting edge of the edge-emitting laser diode when the edge-emitting laser diode is received in the support structure.

In at least some embodiments, a dimension of the slit that is horizontal with respect to the base portion may be less than a dimension of the recess that is horizontal with respect to the base portion.

In at least some embodiments, the apparatus may further include a cylindrical-shaped collimating lens disposed on the distal end of the support structure.

In yet another aspect, a silicon-based thermal energy transfer apparatus that aids dissipation of thermal energy from edge-emitting laser diodes may include a base portion and a support portion. The base portion may be made of silicon and may include a first primary surface. The first primary surface may include at least first and second V-notch grooves thereon. The support portion may be made of silicon and may include a mounting end and a distal end opposite the mounting end. The mounting end may include at least first and second edges that are interlockingly received in the first and second V-notch grooves when the support portion is mounted on the base portion. The support structure may include a recess configured to receive an edge-emitting laser diode. The support structure may further include a slit connecting the distal end and the recess to expose at least a portion of the light-emitting edge of the edge-emitting laser diode when the edge-emitting laser diode is received in the support structure.

In at least some embodiments, a dimension of each the slits that is horizontal with respect to the base portion may be less than a dimension of the respective one of the recesses that is horizontal with respect to the base portion.

In at least some embodiments, the support structure may include first and second fin portions made of silicon and extending longitudinally from the first primary surface of the base portion. The first fin portion may include a first primary end received by the base portion and a second primary end opposite the first primary end of the first fin portion. The first fin portion may further include a first primary surface facing the second fin portion and a second primary surface opposite the first primary surface of the first fin portion. The first and second primary surfaces of the first fin portion may extend between the first and second primary ends of the first fin portion. The second fin portion may include a first primary end received by the base portion and a second primary end opposite the first primary end of the second fin portion. The second fin portion may further include a first primary surface facing the first fin portion and a second primary surface opposite the first primary surface of the second fin portion. The first and second primary surfaces of the second fin portion may extend between the first and second primary ends of the second fin portion. The first primary surface of the first fin portion may include the recess configured to receive the edge-emitting laser diode. The recess may include a primary recess surface that is generally parallel to the first primary surface of the first fin portion. The first fin portion may further include an opening between the recess and the second primary end of the first fin portion such that the primary recess surface extends to the second primary end of the first fin portion.

In at least some embodiments, the apparatus may further include a cylindrical-shaped collimating lens disposed on the distal end of the support structure.

This summary is provided to introduce concepts relating to a silicon-based thermal energy transfer apparatus that aids dissipation of thermal energy from a heat-generating device. The proposed techniques are further described below in the detailed description. This summary is not intended to identify essential features of the claimed subject matter, nor is it intended for use in determining the scope of the claimed subject matter.

BRIEF DESCRIPTION OF THE DRAWINGS

The accompanying drawings are included to provide a further understanding of the disclosure, and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

FIGS. 5 and 5A are each a side view of the apparatus shown in FIG. 4 according to one non-limiting illustrated embodiment.

DETAILED DESCRIPTION OF PREFERRED EMBODIMENTS

Figure 1:
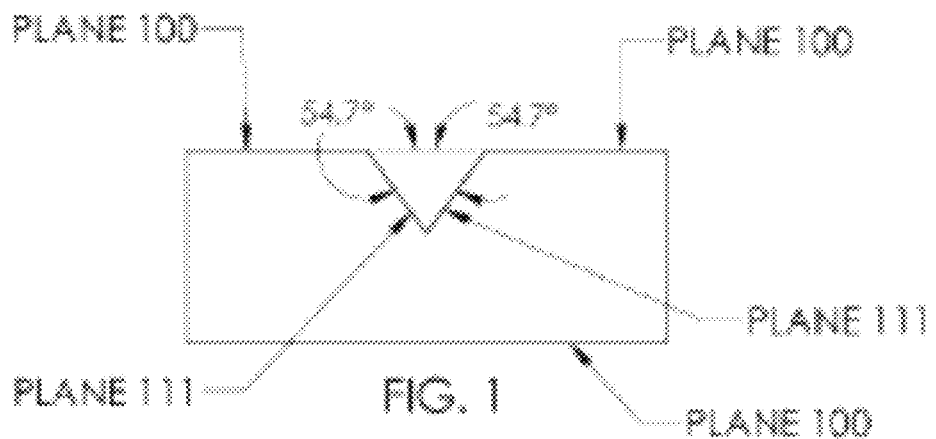
FIGS. 1-3 are each a diagram showing a cross-sectional view of a chemically etched groove in a single-crystal silicon wafer according to one non-limiting illustrated embodiment.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with diode lasers, solar cells, heat exchangers and heat pipes have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings and Abstract of the Disclosure provided herein are for convenience only and do not interpret the scope or meaning of the embodiments.

Overview of Lens Support Structure for Diode Laser

Currently, methods to etch a single-crystal silicon wafer to make V-notch grooves or V-notch derived grooves are known. A single-crystal silicon wafer can be etched to form a V-notch groove, V-notch derived groove, or a rectangular groove on a surface of the silicon wafer. Many V-notch grooves are used, for example, to position or mount fiber optics for precision alignment purposes. Various V-notch groove angles, relative to a face plane of a single-crystal silicon wafer, can be achieved by etching in an anisotropic chemical process. All of the silicon V-notch groove half angles, units in degrees, are listed in Table 1 below.

TABLE 1

| Angles between Crystal Planes | | | | | |
|---|---|---|---|---|---|
| Angle between planes | <100> plane | <110> plane | <010> plane | <001> plane | <101> plane |
| <100> plane | 0.00 | 45.0 | 90.0 | 90.0 | 45.0 |
| <011> plane | 90.0 | 60.0 | 45.0 | 45.0 | 60.0 |
| <111> plane | 54.7 | 35.3 | 54.7 | 54.7 | 35.3 |
| <211> plane | 35.2 | 30.0 | 65.9 | 65.9 | 30.0 |
| <311> plane | 25.2 | 31.4 | 72.4 | 72.4 | 31.4 |
| <511> plane | 15.8 | 35.2 | 78.9 | 78.9 | 35.2 |
| <711> plane | 11.4 | 37.6 | 81.9 | 81.9 | 37.6 |

Accordingly, V-notch grooves, V-notch derived grooves, and rectangular grooves can be engineered on a support plate component to interlock with other components to support construction of a three-dimensional structure out of a face plane on the support plate where one or more grooves are located.

Figure 2:
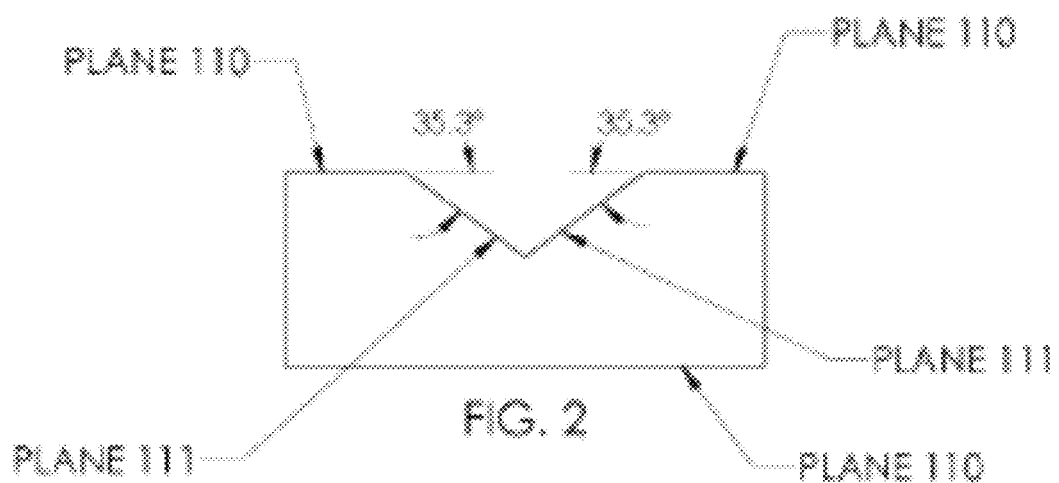
Figure 3:
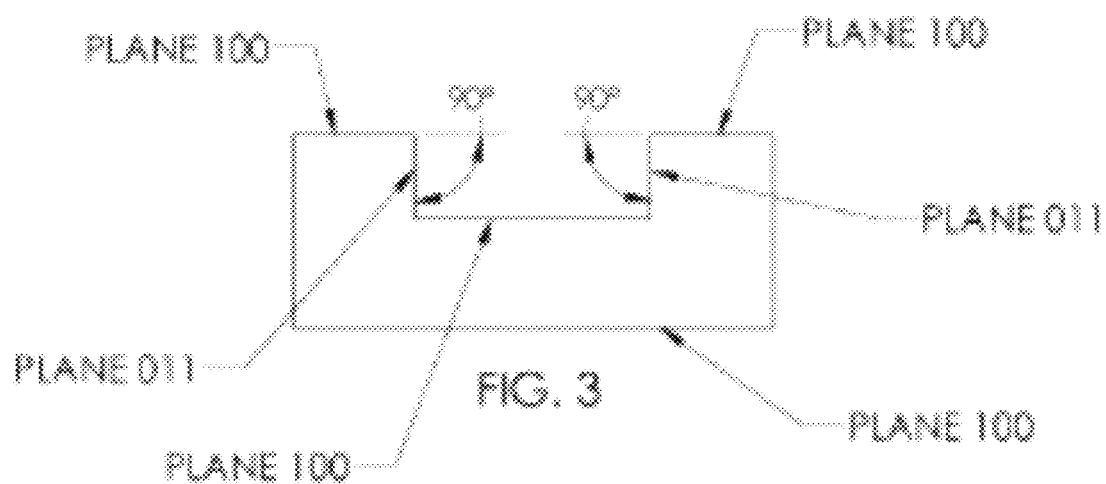

Each of FIGS. 1-3 illustrates a cross-sectional view of a chemically etched groove in a single-crystal silicon wafer according to one non-limiting illustrated embodiment.

FIG. 1 illustrates a cross-sectional view of a V-notch groove on a top surface of a single-crystal silicon wafer etched by potassium hydroxide (KOH) or by other chemical process. The silicon wafer shown in FIG. 1 has a <100> silicon crystal plane as a face plane. An angle of 54.7 degrees results when an etched plane and the face plane of the silicon wafer when the etched plane coincides with a <111> silicon crystal plane of the silicon wafer. The single-crystal silicon wafer may also be etched to produce an edge in the form of a V-shaped wedge that is substantially complementary to the V-notch groove etched on the top surface of the silicon wafer. That is, such edge has a V-shaped wedge that can fit complementarily in the V-notch groove.

FIG. 2 illustrates a cross-sectional view of a V-notch groove on a top surface of a single-crystal silicon wafer etched by KOH or by other chemical process. The silicon wafer shown in FIG. 2 has a <110> silicon crystal plane as a face plane. An angle of 35.3 degrees results when an etched plane and the face plane of the silicon wafer when the etched plane coincides with a <111> silicon crystal plane of the silicon wafer. The single-crystal silicon wafer may also be etched to produce an edge in the form of a V-shaped wedge that is substantially complementary to the V-notch groove etched on the top surface of the silicon wafer. That is, such edge has a V-shaped wedge that can fit complementarily in the V-notch groove.

FIG. 3 illustrates a cross-sectional view of a rectangular groove on a top surface of a single-crystal silicon wafer etched by KOH or by other chemical process. The silicon wafer shown in FIG. 3 has a <100> silicon crystal plane as a face plane. An angle of 90.0 degrees results when an etched plane and the face plane of the silicon wafer when the etched plane coincides with a <011> silicon crystal plane of the silicon wafer. The single-crystal silicon wafer may also be etched to produce an edge in the form of a rectangular wedge that is substantially complementary to the rectangular groove etched on the top surface of the silicon wafer. That is, such edge has a rectangular wedge that can fit complementarily in the rectangular groove.

It should be understood that the various shapes of grooves as illustrated in FIGS. 1-3 are only some of the embodiments and should not be construed as an exhaustive listing of all the embodiments within the scope of the present disclosure. Furthermore, although the illustrated embodiments are directed to a single-crystal silicon wafer, other non-metal materials including multi-crystal silicon wafers and ceramic materials, such as beryllium oxide, aluminum oxide, or silicon carbide for example, may be used as the material from which components of the embodiments disclosed herein can be fabricated. Grooves of other shapes achievable by etching or cutting a single-crystal silicon wafer, a multi-crystal silicon wafer, another silicon-based material, or a ceramic material are also within the scope of the present disclosure.

Figure 4:
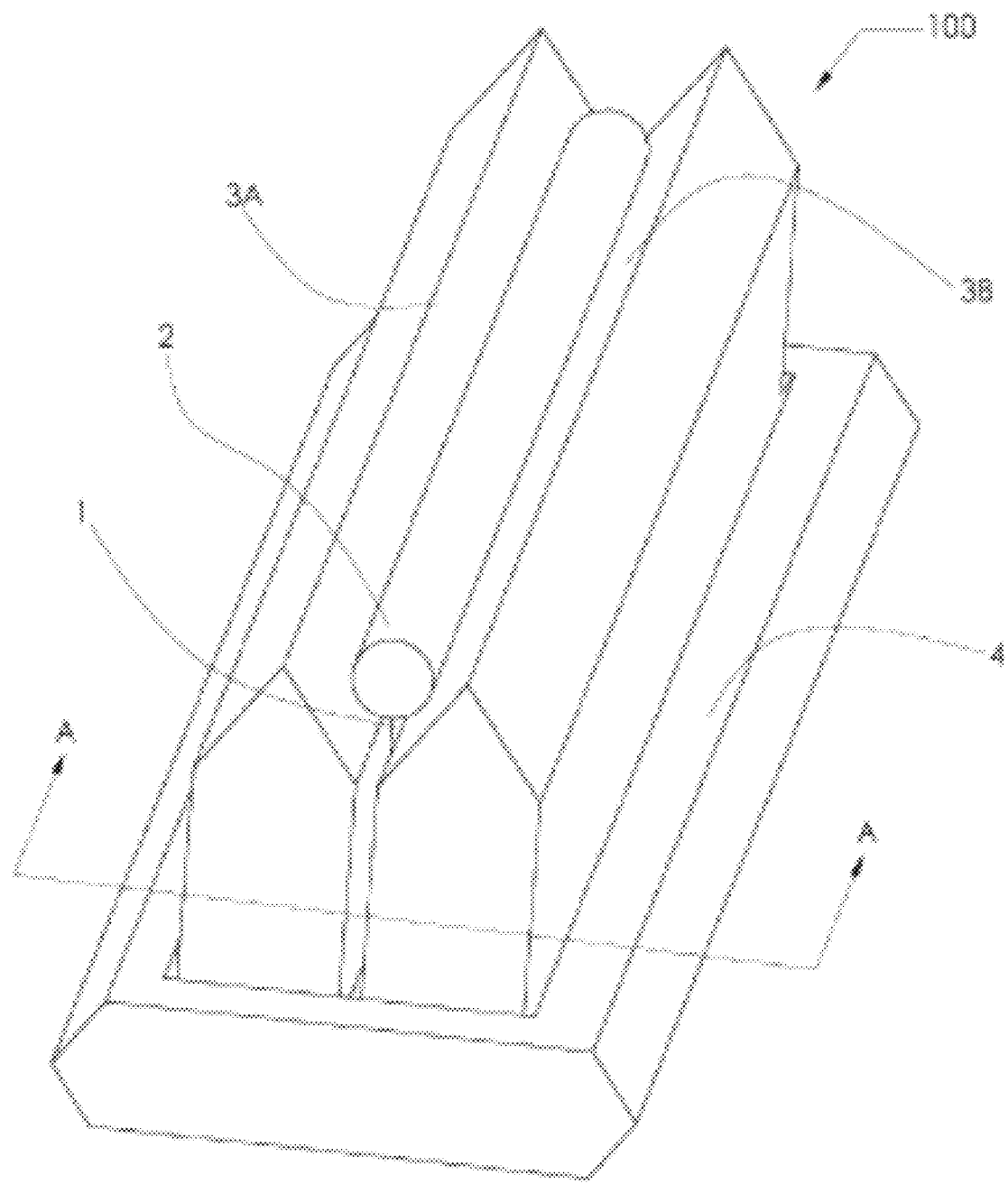
FIG. 4 is an assembly diagram of an apparatus according to one non-limiting illustrated embodiment.

FIG. 4 illustrates an apparatus 100 according to one non-limiting illustrated embodiment. The apparatus 100 includes a silicon-based support plate 4, a silicon-based first fin structure 3A, and a silicon-based second fin structure 3B. In one embodiment, at least one of the support plate 4, the first fin structure 3A and the second fin structure 3B is made from a single-crystal silicon wafer. In another embodiment, each of the support plate 4, the first fin structure 3A and the second fin structure 3B is made from a respective one or the same single-crystal silicon wafer. The support plate 4 has a first primary surface and a second primary surface opposite the first primary surface. Each of the first fin structure 3A and the second fin structure 3B has a first primary surface, a second primary surface opposite the first primary surface, and a plurality of edges between the first and the second primary surfaces including a first edge and a second edge opposite the first edge. The first fin structure 3A is physically coupled to the support plate 4 with the first edge of the first fin structure 3A attached to the first primary surface of the support plate 4. The second fin structure 3B is physically coupled to the support plate 4 with the first edge of the second fin structure 3B attached the first primary surface of the support plate 4. In one embodiment, the first and the second fin structures 3A, 3B are attached to the support plate 4 in a manner such that at least one of the primary surfaces of the first fin structure 3A is substantially parallel to at least one of the primary surfaces of the second fin structure 3B. In another embodiment, at least one of the first and the second fin structures 3A, 3B is attached to the support plate 4 by metal soldering, epoxy boding, eutectic bonding, anodic bonding, diffusion bonding, or a combination thereof.

As shown in FIG. 4, the apparatus 100 may also include a light emitter 1. In one embodiment, the light emitter 1 is a diode laser, such as a laser diode bar. In another embodiment, the light emitter 1 is a light-emitting diode. The light emitter 1 is physically coupled between the first fin structure 3A and the second fin structure 3B. More specifically, the light emitter 1 is physically coupled between the first fin structure 3A and the second fin structure 3B such that the beam of light, such as a laser beam in the case that the light emitter 1 is a diode laser, is emitted in a direction away from the support plate 4. When attached to the support plate 4, the first fin structure 3A and the second fin structure 3B are spaced apart by a distance that is approximately a thickness of the light emitter 1 to allow the light emitter 1 to be physically coupled between the first and the second fin structures 3A, 3B. In one embodiment, the primary surface of the first fin structure 3A that the light emitter 1 is physically coupled to includes a recessed portion, and the light emitter 1 is physically coupled to the recessed portion of that primary surface of the first fin structure 3A. In another embodiment, the primary surface of the second fin structure 3B that the light emitter 1 is physically coupled to includes a recessed portion, and the light emitter 1 is physically coupled to the recessed portion of that primary surface of the first fin structure 3B.

In one embodiment, the surfaces of each of the first and the second fin structures 3A, 3B are metalized. In another embodiment, at least a portion of at least one of the first and the second primary surfaces of each of the first and the second fin structures 3A, 3B is metalized. That is, at least a portion of the surface of each of the fin structures 3A, 3B that is in physical contact with the light emitter 1 is metalized to provide electrical conductivity to allow electrical power to be provided to the light emitter 1. Powering of the light emitter 1 is well known in the art. Thus, in the interest of brevity, detailed description of powering of the light emitter 1 will not be provided herein and the associated wiring and circuitry will not be shown in the figures.

In one embodiment, the first primary surface of the support plate 4 includes indentation for the first and the second fin structures 3A, 3B to attach to. For example, the support plate 4 may include at least a first groove and a second groove on the first primary surface. The first fin structure 3A may be attached to the support plate 4 with the first edge of the first fin structure 3A received in the first groove of the support plate 4. Likewise, the second fin structure 3B may be attached to the support plate 4 with the first edge of the second fin structure 3B received in the second groove of the support plate 4. In one embodiment, the support plate 4 is a single-crystal silicon wafer having a <100> silicon crystal plane as the first primary surface, and at least one of the first and the second grooves is a V-notch groove having two slopes each having an angle of 54.7 degrees measured from the first primary surface as shown in FIG. 1. In another embodiment, the support plate 4 is a single-crystal silicon wafer having a <110> silicon crystal plane as the first primary surface, and at least one of the first and the second grooves is a V-notch groove having two slopes each having an angle of 35.3 degrees measured from the first primary surface as shown in FIG. 2. In yet another embodiment, the support plate 4 is a single-crystal silicon wafer having a <100> silicon crystal plane as the first primary surface, and at least one of the first and the second grooves is a rectangular groove as shown in FIG. 3.

In one embodiment, at least one of the first and the second fin structures 3A, 3B is made from a single-crystal silicon wafer that has a <100> silicon crystal plane as a face plane, and at least one edge of at least one of the first and the second fin structures 3A, 3B is etched to form at least one sloped surface having an angle of 54.7 degrees between the <100> and a <111> silicon crystal planes. In another embodiment, at least one of the first and the second fin structures 3A, 3B is made from a single-crystal silicon wafer that has a <110> silicon crystal plane as a face plane, and at least one edge of at least one of the first and the second fin structures 3A, 3B is etched to form at least one sloped surface having an angle of 35.3 degrees between the <110> and a <111> silicon crystal planes.

As shown in FIG. 4, the apparatus 100 may further include a collimating device 2. The collimating device is received, or otherwise attached, between the first and the second fin structures 3A, 3B and positioned to collimate the beam of light emitted from the light emitter 1. In one embodiment, the collimating device 2 is a rod lens. In another embodiment, the collimating device 2 is a substantially cylindrical lens with a high numerical aperture. In yet another embodiment, the collimating device 2 is a rod lens having at least one substantially flat surface along a longitudinal axis of the rod lens. In still another embodiment, the collimating device 2 is an optical lens having a numerical aperture value in the range of 0.20 to 0.80 for collimation of the beam of light emitted by the light emitter 1. In one embodiment, the collimating device 2 is attached to at least one of the first and the second fin structures 3A, 3B by UV-curing epoxy bonding. Alternatively, the collimating device 2 is attached to at least one of the first and the second fin structures 3A, 3B by soldering.

FIG. 5 illustrates a side view of the apparatus 100 according to one non-limiting illustrated embodiment. The light emitter 1 is physically coupled between the first fin structure 3A and the second fin structure 3B, which are attached to the support plate 4. The first fin structure 3A has primary surfaces 301A, 302A and a second edge having sloped surfaces 303A, 304A. The second fin structure 3B has primary surfaces 301B, 302B and a second edge having sloped surfaces 303B, 304B. In one embodiment, the first and the second fin structures 3A, 3B are each made from a single-crystal silicon wafer and have symmetric shapes. At least a portion of some or all of the surfaces 301A, 302A, 303A, 304A of the first fin structure 3A and the surfaces 301B, 302B, 303B, 304B of the second fin structure 3B are metalized.

A collimating device 2 is attached to the sloped surface 304A of the first fin structure 3A and the sloped surface 303B of the second fin structure 3B. In one embodiment, the light emitter 1 is a laser diode bar that emits a laser beam 5. The laser beam 5 emits from one side of light emitter 1 as shown in FIG. 5 and propagates through the collimating device 2. With the collimating device 2 positioned and distanced appropriately from the light emitter 1, the laser beam 5 is properly collimated by the collimating device 2 in a direction away from the support plate 4. Without proper location control of the collimating device 2, the laser beam 5 cannot be properly collimated. It is therefore important to fabricate and assemble the apparatus 100 with tight precision to maintain good collimation or to fix the divergence of the laser beam 5.

FIG. 5A illustrates an enlarged section A of FIG. 5. As shown in FIG. 5A, the collimating device 2 rests on the second edges of the first and the second fin structures 3A, 3B. The second edges of the first and the second fin structures 3A, 3B are chemically etched to produce an angle θ1 as measured from one of primary surfaces and an angle θ2 as measured from the other primary surface, where θ1 and θ2 may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 3A, 3B is designed so that the sloped surfaces can hold the collimating device 2 in proper position for maintaining an optical working distance so that the collimating device 2 collimates the laser beam 5.

Figure 6:
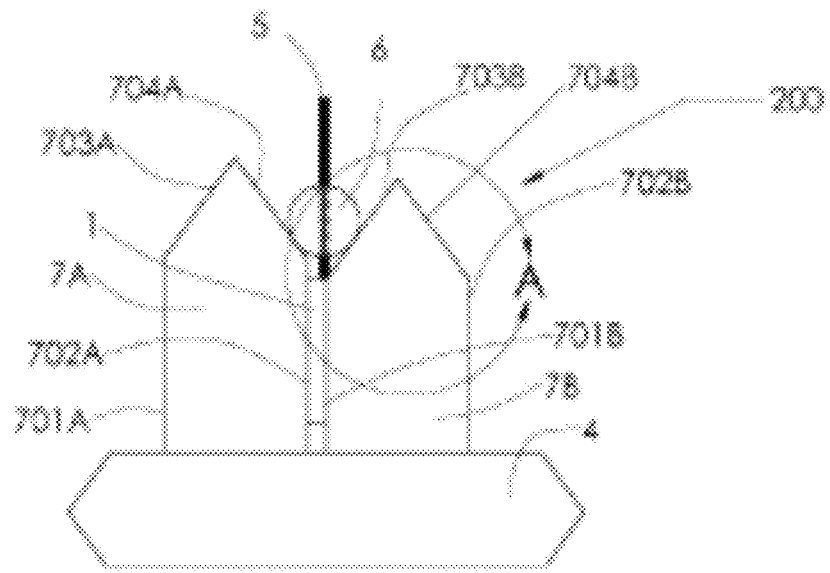
FIGS. 6 and 6A are each a side view of the apparatus shown in FIG. 4 according to another non-limiting illustrated embodiment.

FIG. 6 illustrates an apparatus 200 according to one non-limiting illustrated embodiment. The light emitter 1 is physically coupled between the first fin structure 7A and the second fin structure 7B, which are attached to the support plate 4. The first fin structure 7A has primary surfaces 701A, 702A and a second edge having sloped surfaces 703A, 704A. The second fin structure 7B has primary surfaces 701B, 702B and a second edge having sloped surfaces 703B, 704B. In one embodiment, the first and the second fin structures 7A, 7B are each made from a single-crystal silicon wafer but have asymmetric shapes. At least a portion of some or all of the surfaces 701A, 702A, 703A, 704A of the first fin structure 7A and the surfaces 701B, 702B, 703B, 704B of the second fin structure 7B are metalized.

A collimating device 6 is attached to the sloped surface 704A of the first fin structure 7A and the sloped surface 703B of the second fin structure 7B. In one embodiment, the light emitter 1 is a laser diode bar that emits a laser beam 5. The laser beam 5 emits from one side of light emitter 1 as shown in FIG. 6 and propagates through the collimating device 6. With the collimating device 6 positioned and distanced appropriately from the light emitter 1, the laser beam 5 is properly collimated by the collimating device 6 in a direction away from the support plate 4. Since the laser beam 5 emits from one side of light emitter 1, the first fin structure 7A is constructed to lift the collimating device 6 to catch the laser beam 5 at the center of the collimating device 6 as shown in FIG. 6. The centering of the laser beam 5 to collimating device 6 is done by fabricating asymmetric pieces of fin structures for the first and the second fin structures 7A, 7B. The slopes holding the collimating device 6 in the first and the second fin structures 7A, 7B are designed to hold the collimating device 6 in position to maintain an optical working distance of the collimating device 6 to collimate the laser beam 5. Without proper location control of the collimating device 6, the laser beam 5 cannot be properly collimated. It is therefore important to fabricate and assemble the apparatus 200 with tight precision to maintain good collimation or to fix the divergence of the laser beam 5.

Figure 6A:
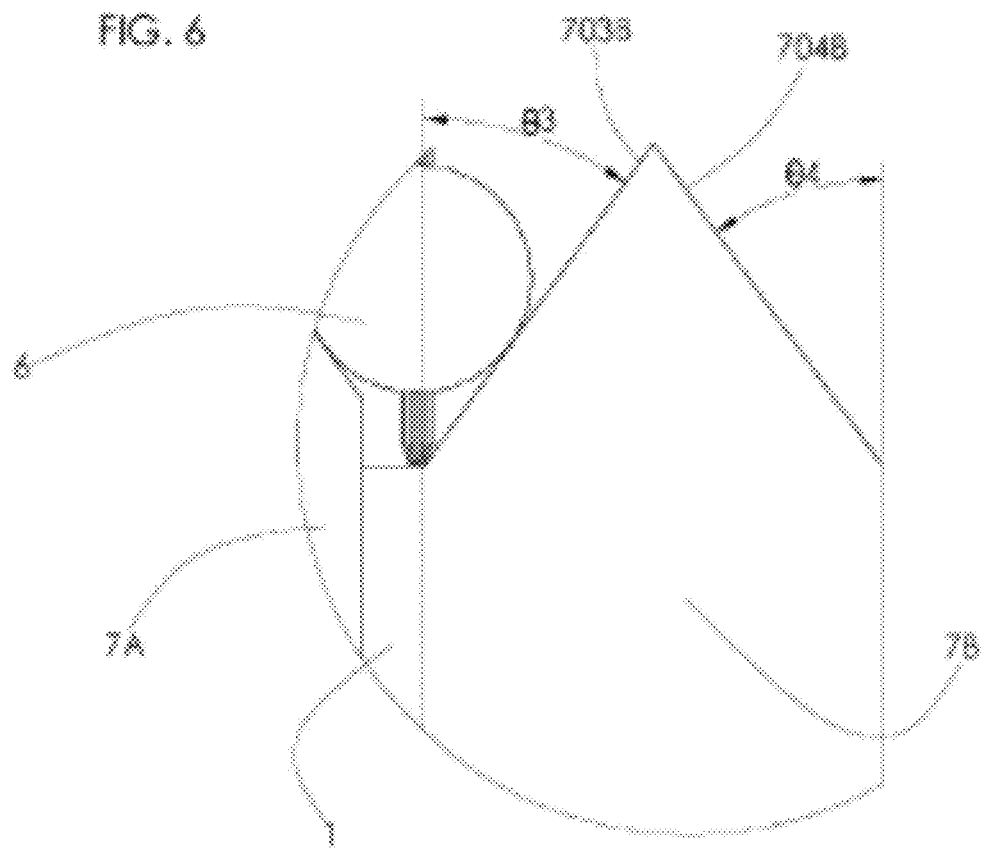

FIG. 6A illustrates an enlarged section A of FIG. 6. As shown in FIG. 6A, the collimating device 6 rests on the second edges of the first and the second fin structures 7A, 7B. The second edges of the first and the second fin structures 7A, 7B are chemically etched to produce an angle θ3 as measured from one of primary surfaces and an angle θ4 as measured from the other primary surface, where θ3 and θ4 may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 7A, 7B is designed so that the sloped surfaces can hold the collimating device 6 in proper position for maintaining an optical working distance so that the collimating device 6 collimates the laser beam 5.

Figure 7:
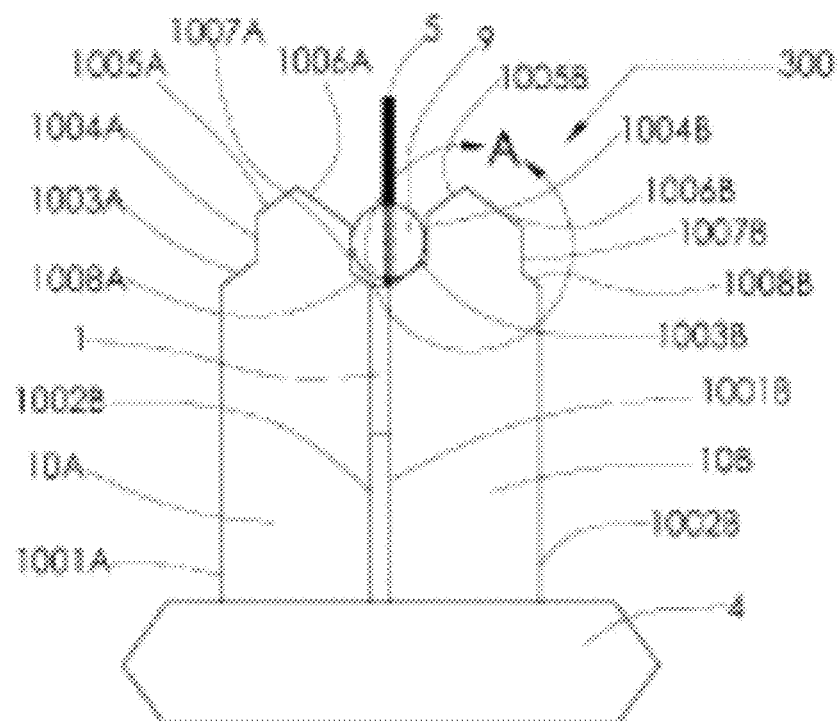
FIGS. 7 and 7A are each a side view of the apparatus shown in FIG. 4 according to another non-limiting illustrated embodiment.

FIG. 7 illustrates an apparatus 300 according to one non-limiting illustrated embodiment. The light emitter 1 is physically coupled between the first fin structure 10A and the second fin structure 10B, which are attached to the support plate 4. The first fin structure 10A has primary surfaces 1001A, 1002A and a second edge having sloped surfaces 1003A, 1005A, 1006A, 1008A. The second fin structure 10B has primary surfaces 1001B, 1002B and a second edge having sloped surfaces 1003B, 1005B, 1006B, 1008B. In one embodiment, the first and the second fin structures 10A, 10B are each made from a single-crystal silicon wafer and have symmetric shapes. At least a portion of some or all of the surfaces 1001A, 1002A, 1003A, 1004A, 1005A, 1006A, 1007A, 1008A of the first fin structure 10A and the surfaces 1001B, 1002B, 1003B, 1004B, 1005B, 1006B, 1007B, 1008B of the second fin structure 10B are metalized.

A collimating device 9 is attached to the vertical surface 1007A of the first fin structure 10A and the sloped surface 1003B and vertical surface 1004B of the second fin structure 10B. In one embodiment, the light emitter 1 is a laser diode bar that emits a laser beam 5. The laser beam 5 emits from one side of light emitter 1 as shown in FIG. 7 and propagates through the collimating device 9. With the collimating device 9 positioned and distanced appropriately from the light emitter 1, the laser beam 5 is properly collimated by the collimating device 9 in a direction away from the support plate 4. Since the laser beam 5 emits from one side of light emitter 1, the first fin structure 10A is constructed to lift the collimating device 9 to catch the laser beam 5 at the center of the collimating device 9 as shown in FIG. 7. The centering of the laser beam 5 to the collimating device 9 is done by fabricating symmetric pieces of fin structures for the first and the second fin structures 10A, 10B. The slopes holding the collimating device 9 in the first and the second fin structures 10A, 10B are designed to hold the collimating device 9 in position to maintain an optical working distance of the collimating device 9 to collimate the laser beam 5. Without proper location control of the collimating device 9, the laser beam 5 cannot be properly collimated. It is therefore important to fabricate and assemble the apparatus 300 with tight precision to maintain good collimation or to fix the divergence of the laser beam 5.

Figure 7A:
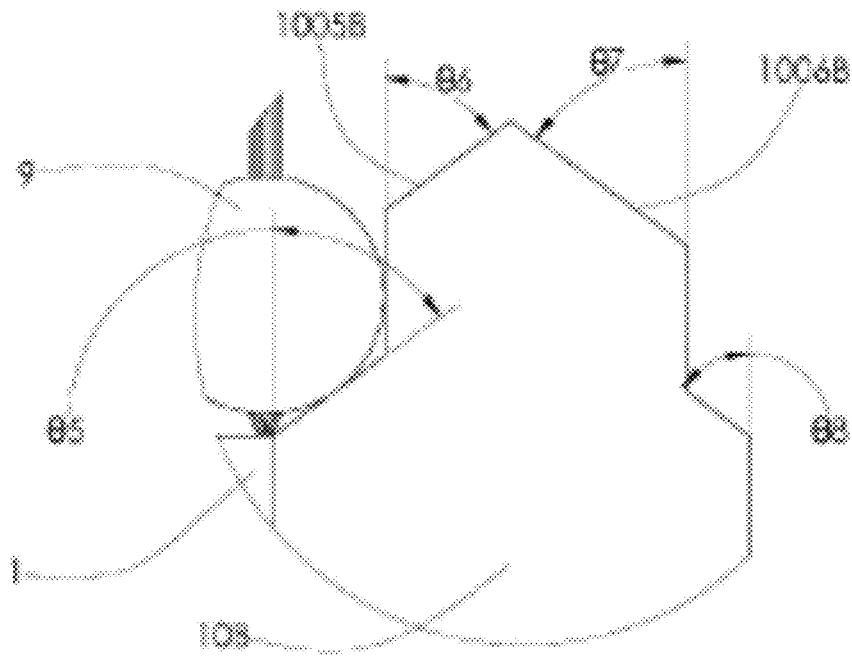

FIG. 7A illustrates an enlarged section A of FIG. 7. As shown in FIG. 7A, the collimating device 9 rests on the second edges of the first and the second fin structures 10A, 10B. The second edges of the first and the second fin structures 10A, 10B are chemically etched to produce angles θ5, θ6 as measured from one of primary surfaces and angles θ7, θ8 as measured from the other primary surface, where θ5, θ6, θ7, θ8 may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 10A, 10B is designed so that the sloped surfaces can hold the collimating device 9 in proper position for maintaining an optical working distance so that the collimating device 9 collimates the laser beam 5.

Figure 8:
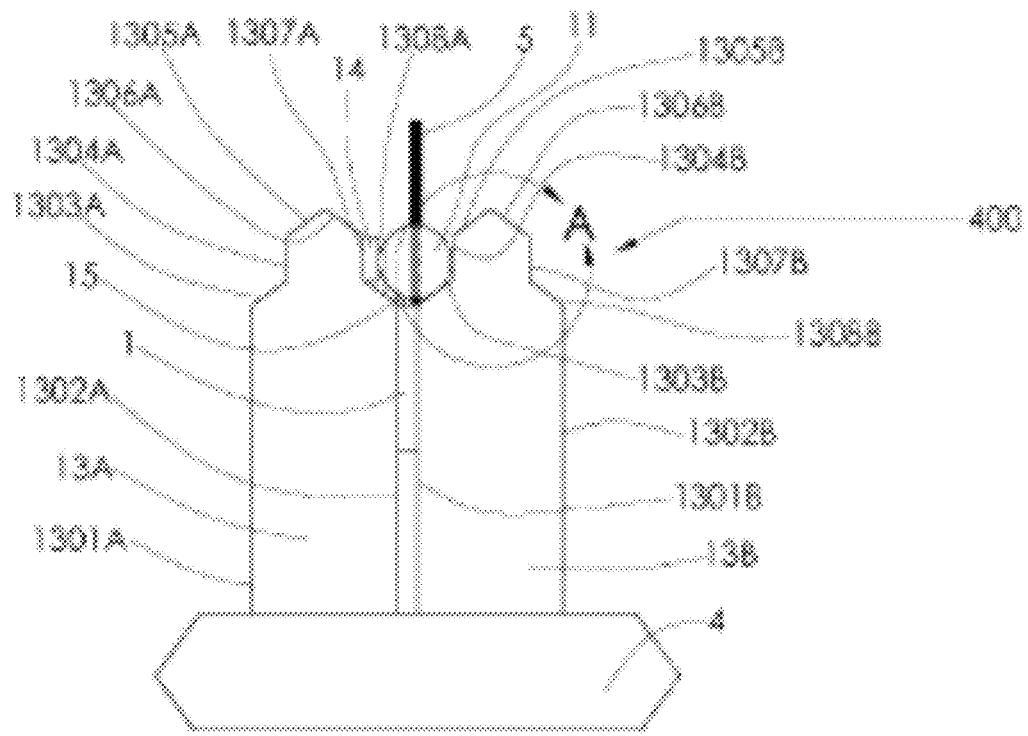
FIGS. 8 and 8A are each a side view of the apparatus shown in FIG. 4 according to another non-limiting illustrated embodiment.

FIG. 8 illustrates an apparatus 400 according to one non-limiting illustrated embodiment. The light emitter 1 is physically coupled between the first fin structure 13A and the second fin structure 13B, which are attached to the support plate 4. The first fin structure 13A has primary surfaces 1301A, 1302A and a second edge having sloped surfaces 1303A, 1305A, 1306A, 1308A. The second fin structure 13B has primary surfaces 1301B, 1302B and a second edge having sloped surfaces 1303B, 1305B, 1306B, 1308B. In one embodiment, the first and the second fin structures 13A, 13B are each made from a single-crystal silicon wafer and have symmetric shapes. At least a portion of some or all of the surfaces 1301A, 1302A, 1303A, 1304A, 1305A, 1306A, 1307A, 1308A of the first fin structure 13A and the surfaces 1301B, 1302B, 1303B, 1304B, 1305B, 1306B, 1307B, 1308B of the second fin structure 13B are metalized.

A collimating device 11 is attached to the sloped surface 1303B and vertical surface 1304B of the second fin structure 13B. In one embodiment, the light emitter 1 is a laser diode bar that emits a laser beam 5. The laser beam 5 emits from one side of light emitter 1 as shown in FIG. 8 and propagates through the collimating device 11. With the collimating device 11 positioned and distanced appropriately from the light emitter 1, the laser beam 5 is properly collimated by the collimating device 11 in a direction away from the support plate 4. Since the laser beam 5 emits from one side of the light emitter 1, the first and the second fin structures 13A, 13B are constructed to catch the laser beam 5 at the center of the collimating device 11 as shown in FIG. 8. In order to maintain the proper position of the collimating device 11, a shim 14 and spacer 15 are used to hold the collimating device 11 in place. The centering of the laser beam 5 to the collimating device 11 is done by fabricating symmetric pieces of fin structures for the first and the second fin structures 13A, 13B, with the use of the shim 14 and the spacer 15. The slopes holding the collimating device 11 in the first and the second fin structures 13A, 13B are designed to hold the collimating device 11 in position, with the aid of the shim 14 and the spacer 15, to maintain an optical working distance of the collimating device 11 to collimate the laser beam 5. Without proper location control of the collimating device 11, the laser beam 5 cannot be properly collimated. It is therefore important to fabricate and assemble the apparatus 400 with tight precision to maintain good collimation or to fix the divergence of the laser beam 5.

Figure 8A:
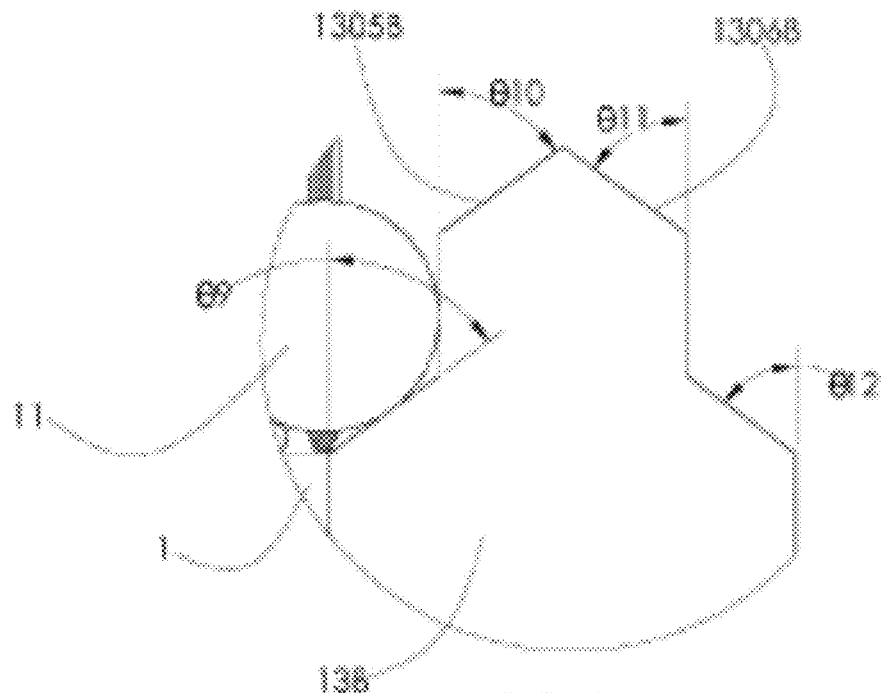

FIG. 8A illustrates an enlarged section A of FIG. 8. As shown in FIG. 8A, the collimating device 11 rests on the second edges of the first and the second fin structures 13A, 13B. The second edges of the first and the second fin structures 13A, 13B are chemically etched to produce angles θ9, θ10 as measured from one of primary surfaces and angles θ11, θ12 as measured from the other primary surface, where θ9, θ10, θ11, θ12 may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 13A, 13B is designed so that the sloped surfaces can hold the collimating device 11 in proper position for maintaining an optical working distance so that the collimating device 11 collimates the laser beam 5.

Figure 9:
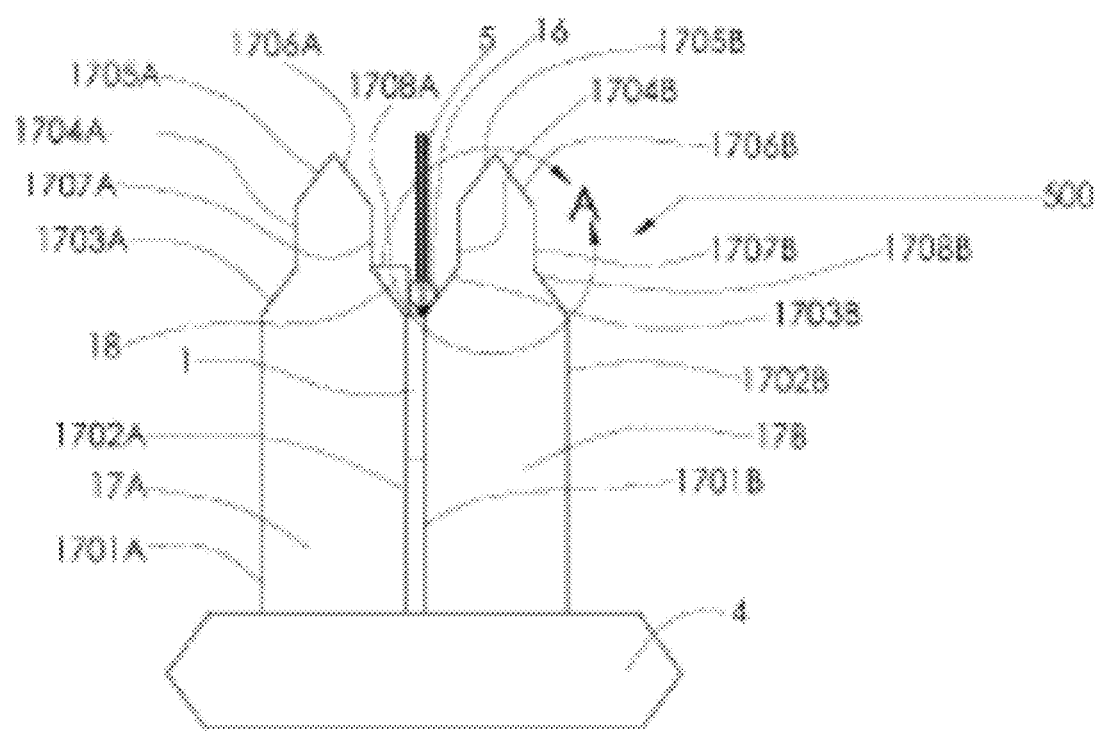
FIGS. 9 and 9A are each a side view of the apparatus shown in FIG. 4 according to another non-limiting illustrated embodiment.

FIG. 9 illustrates an apparatus 500 according to one non-limiting illustrated embodiment. The light emitter 1 is physically coupled between the first fin structure 17A and the second fin structure 17B, which are attached to the support plate 4. The first fin structure 17A has primary surfaces 1701A, 1702A and a second edge having sloped surfaces 1703A, 1705A, 1706A, 1708A. The second fin structure 17B has primary surfaces 1701B, 1702B and a second edge having sloped surfaces 1703B, 1705B, 1706B, 1708B. In one embodiment, the first and the second fin structures 17A, 17B are each made from a single-crystal silicon wafer and have symmetric shapes. At least a portion of some or all of the surfaces 1701A, 1702A, 1703A, 1704A, 1705A, 1706A, 1707A, 1708A of the first fin structure 17A and the surfaces 1701B, 1702B, 1703B, 1704B, 1705B, 1706B, 1707B, 1708B of the second fin structure 17B are metalized.

A collimating device 16 is attached to the sloped surface 1703B of the second fin structure 17B. In one embodiment, the light emitter 1 is a laser diode bar that emits a laser beam 5. The laser beam 5 emits from one side of light emitter 1 as shown in FIG. 9 and propagates through the collimating device 16. With the collimating device 16 positioned and distanced appropriately from the light emitter 1, the laser beam 5 is properly collimated by the collimating device 16 in a direction away from the support plate 4. Since the laser beam 5 emits from one side of the light emitter 1, the first and the second fin structures 17A, 17B are constructed to catch the laser beam 5 at the center of the collimating device 16 as shown in FIG. 9. In order to maintain the proper position of the collimating device 16, a wedge shim 18 is used to hold the collimating device 16 in place. The centering of the laser beam 5 to the collimating device 16 is done by fabricating symmetric pieces of fin structures for the first and the second fin structures 17A, 17B, with the use of the wedge shim 18. The slopes holding the collimating device 16 in the first and the second fin structures 17A, 17B are designed to hold the collimating device 16 in position, with the aid of the wedge shim 17, to maintain an optical working distance of the collimating device 16 to collimate the laser beam 5. Without proper location control of the collimating device 16, the laser beam 5 cannot be properly collimated. It is therefore important to fabricate and assemble the apparatus 500 with tight precision to maintain good collimation or to fix the divergence of the laser beam 5.

Figure 9A:
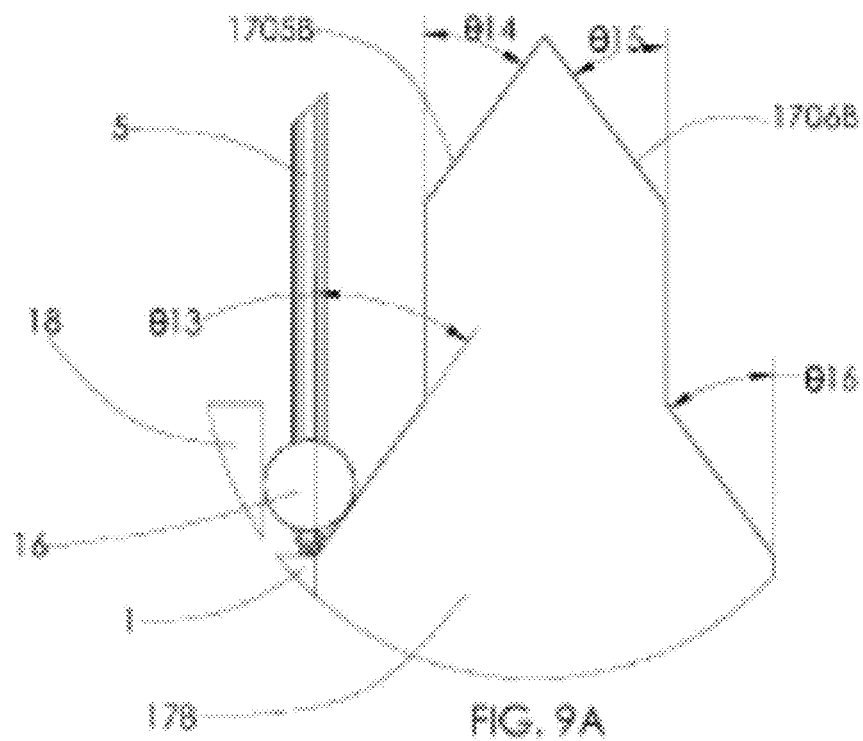

FIG. 9A illustrates an enlarged section A of FIG. 9. As shown in FIG. 9A, the collimating device 16 rests on the second edges of the first and the second fin structures 17A, 17B. The second edges of the first and the second fin structures 17A, 17B are chemically etched to produce angles θ13, θ14 as measured from one of primary surfaces and angles θ15, θ16 as measured from the other primary surface, where θ13, θ14, θ15, θ16 may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 17A, 17B is designed so that the sloped surfaces can hold the collimating device 16 in proper position for maintaining an optical working distance so that the collimating device 16 collimates the laser beam 5.

Figure 10:
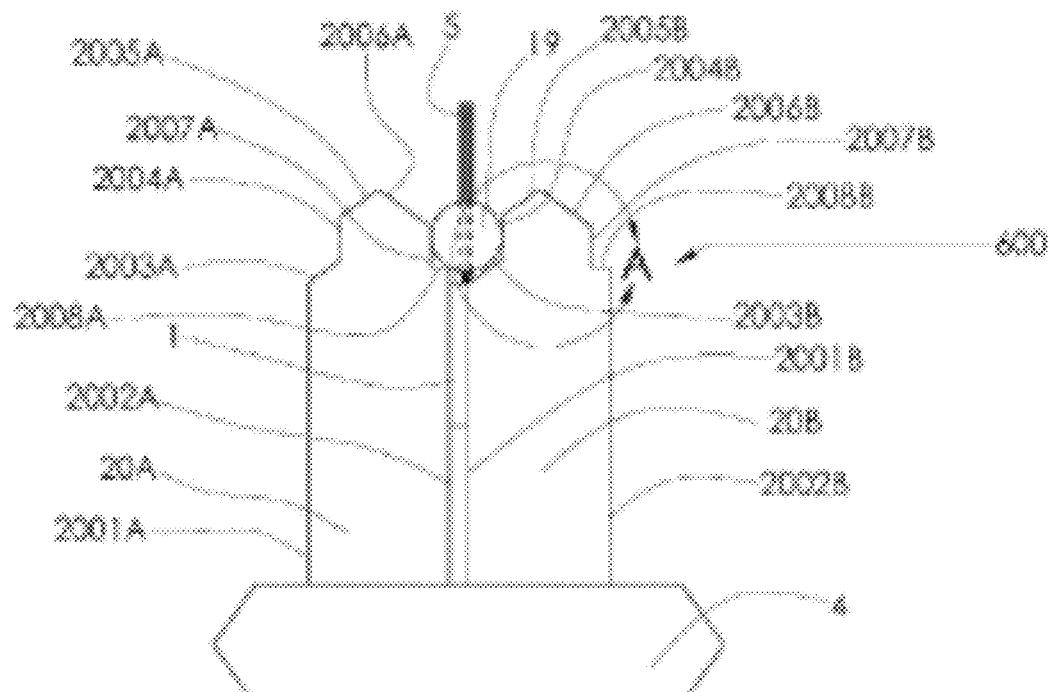
FIGS. 10 and 10A are each a side view of the apparatus shown in FIG. 4 according to another non-limiting illustrated embodiment.

FIG. 10 illustrates an apparatus 600 according to one non-limiting illustrated embodiment. The light emitter 1 is physically coupled between the first fin structure 20A and the second fin structure 20B, which are attached to the support plate 4. The first fin structure 20A has primary surfaces 2001A, 2002A and a second edge having sloped surfaces 2003A, 2005A, 2006A. The second fin structure 20B has primary surfaces 2001B, 2002B and a second edge having sloped surfaces 2003B, 2005B, 2006B. In one embodiment, the first and the second fin structures 20A, 20B are each made from a single-crystal silicon wafer and have symmetric shapes. At least a portion of some or all of the surfaces 2001A, 2002A, 2003A, 2004A, 2005A, 2006A, 2007A, 2008A of the first fin structure 20A and the surfaces 2001B, 2002B, 2003B, 2004B, 2005B, 2006B, 2007B, 2008B of the second fin structure 20B are metalized.

A collimating device 19 is attached to the vertical surface 2007A of the first fin structure 20A and the vertical surface 2004B of the second fin structure 20B. In one embodiment, the light emitter 1 is a laser diode bar that emits a laser beam 5. The laser beam 5 emits from one side of light emitter 1 as shown in FIG. 10 and propagates through the collimating device 19. With the collimating device 19 positioned and distanced appropriately from the light emitter 1, the laser beam 5 is properly collimated by the collimating device 19 in a direction away from the support plate 4. Since the laser beam 5 emits from one side of the light emitter 1, the first and the second fin structures 20A, 20B are constructed to catch the laser beam 5 at the center of the collimating device 19 as shown in FIG. 10. The centering of the laser beam 5 to the collimating device 19 is done by fabricating symmetric pieces of fin structures for the first and the second fin structures 20A, 20B. The vertical walls and edges holding the collimating device 19 in the first and the second fin structures 20A, 20B are designed to hold the collimating device 19 in a proper position for maintaining an optical working distance of the collimating device 19 to collimate the laser beam 5. Without proper location control of the collimating device 19, the laser beam 5 cannot be properly collimated. It is therefore important to fabricate and assemble the apparatus 600 with tight precision to maintain good collimation or to fix the divergence of the laser beam 5.

Figure 10A:
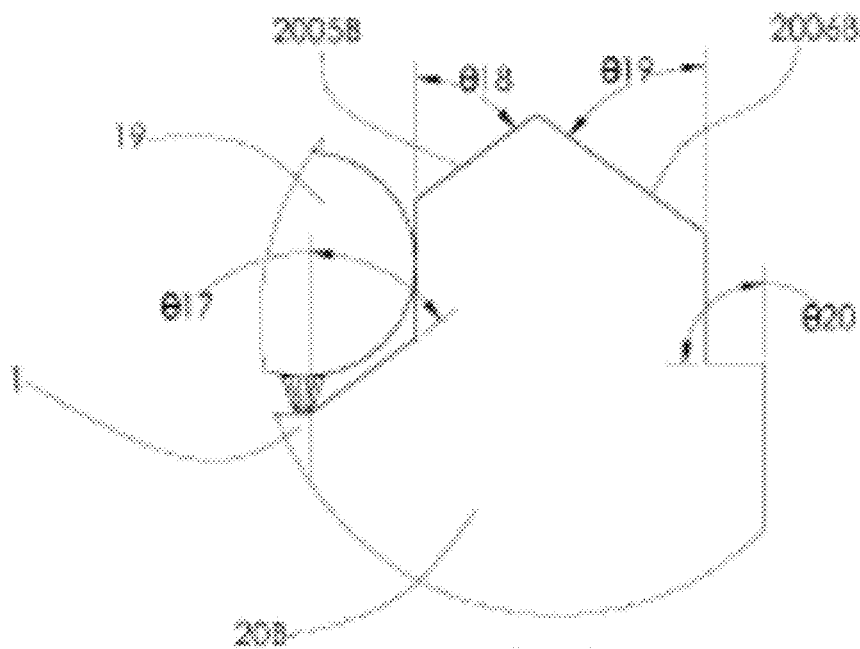

FIG. 10A illustrates an enlarged section A of FIG. 10. As shown in FIG. 10A, the collimating device 19 rests on the second edges of the first and the second fin structures 20A, 20B. The second edges of the first and the second fin structures 20A, 20B are chemically etched to produce angles $\theta17$, $\theta18$ as measured from one of primary surfaces and angles $\theta19$, $\theta20$ as measured from the other primary surface, where $\theta17$, $\theta18$, $\theta19$ may or may not be equal and each may be 54.7 or 35.3 degrees. The angle $\theta20$ is a 90-degree angle as measured from the same primary surface the angle $\theta19$ is measured from. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 20A, 20B is designed so that the sloped surfaces can hold the collimating device 19 in proper position for maintaining an optical working distance so that the collimating device 19 collimates the laser beam 5.

Figure 11:
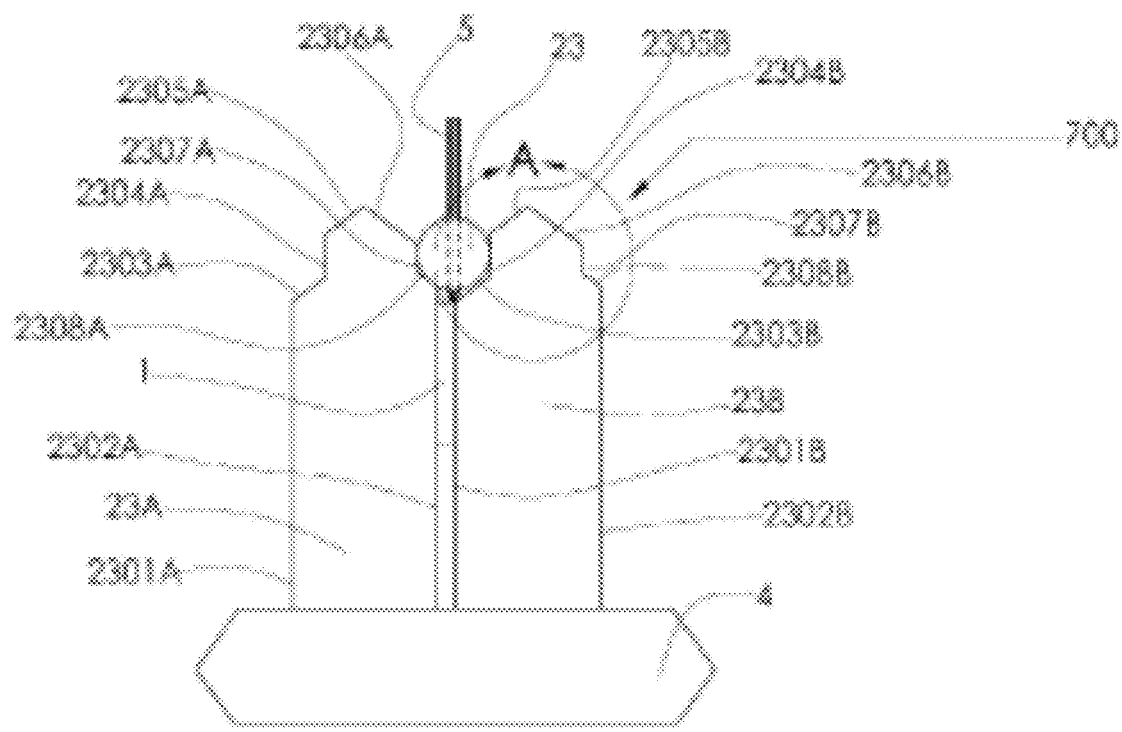
FIGS. 11 and 11A are each a side view of the apparatus shown in FIG. 4 according to another non-limiting illustrated embodiment.

FIG. 11 illustrates an apparatus 700 according to one non-limiting illustrated embodiment. The light emitter 1 is physically coupled between the first fin structure 23A and the second fin structure 23B, which are attached to the support plate 4. The first fin structure 23A has primary surfaces 2301A, 2302A and a second edge having sloped surfaces 2303A, 2305A, 2306A, 2308A. The second fin structure 23B has primary surfaces 2301B, 2302B and a second edge having sloped surfaces 2303B, 2305B, 2306B, 2308B. In one embodiment, the first and the second fin structures 23A, 23B are each made from a single-crystal silicon wafer and have symmetric shapes. At least a portion of some or all of the surfaces 2301A, 2302A, 2303A, 2304A, 2305A, 2306A, 2307A, 2308A of the first fin structure 23A and the surfaces 2301B, 2302B, 2303B, 2304B, 2305B, 2306B, 2307B, 2308B of the second fin structure 23B are metalized.

A collimating device 23 is attached to the sloped surfaces 2307A and 2308A of the first fin structure 23A and the vertical surface 2304B of the second fin structure 23B. In one embodiment, the light emitter 1 is a laser diode bar that emits a laser beam 5. The laser beam 5 emits from one side of light emitter 1 as shown in FIG. 11 and propagates through the collimating device 23. With the collimating device 23 positioned and distanced appropriately from the light emitter 1, the laser beam 5 is properly collimated by the collimating device 23 in a direction away from the support plate 4. Since the laser beam 5 emits from one side of the light emitter 1, the first and the second fin structures 23A, 23B are constructed to catch the laser beam 5 at the center of the collimating device 23 as shown in FIG. 11. The centering of the laser beam 5 to the collimating device 23 is done by fabricating symmetric pieces of fin structures for the first and the second fin structures 23A, 23B. The slope and vertical wall holding the collimating device 23 in the first and the second fin structures 23A, 23B are designed to hold the collimating device 23 in a proper position for maintaining an optical working distance of the collimating device 23 to collimate the laser beam 5. Without proper location control of the collimating device 23, the laser beam 5 cannot be properly collimated. It is therefore important to fabricate and assemble the apparatus 700 with tight precision to maintain good collimation or to fix the divergence of the laser beam 5.

Figure 11A:
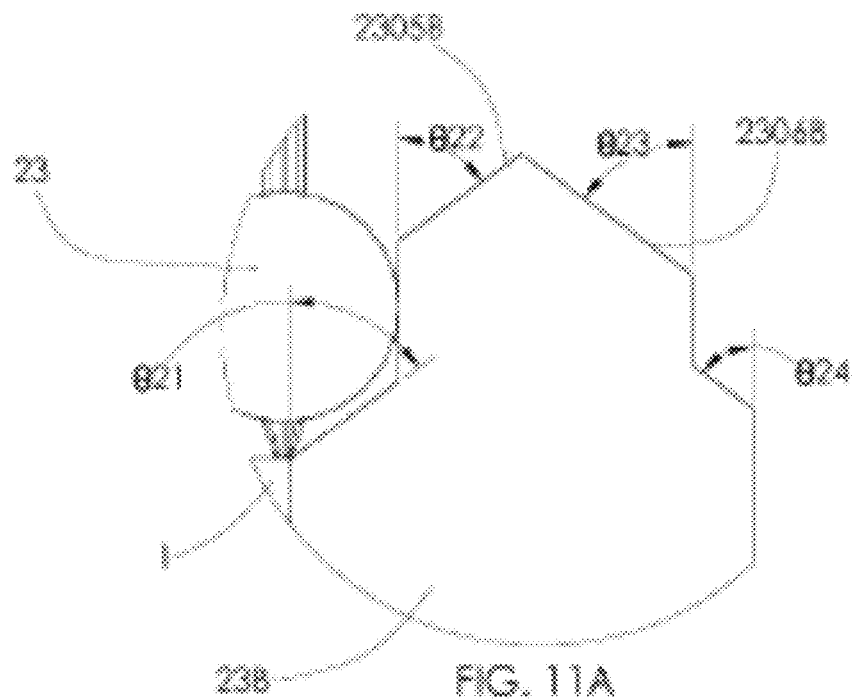

FIG. 11A illustrates an enlarged section A of FIG. 11. As shown in FIG. 11A, the collimating device 23 rests on the second edges of the first and the second fin structures 23A, 23B. The second edges of the first and the second fin structures 23A, 23B are chemically etched to produce angles $\theta21$, $\theta22$ as measured from one of primary surfaces and angles $\theta23$, $\theta24$ as measured from the other primary surface, where $\theta21$, $\theta22$, $\theta23$, $\theta24$ may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 23A, 23B is designed so that the sloped surfaces can hold the collimating device 23 in proper position for maintaining an optical working distance so that the collimating device 23 collimates the laser beam 5.

Figure 12:
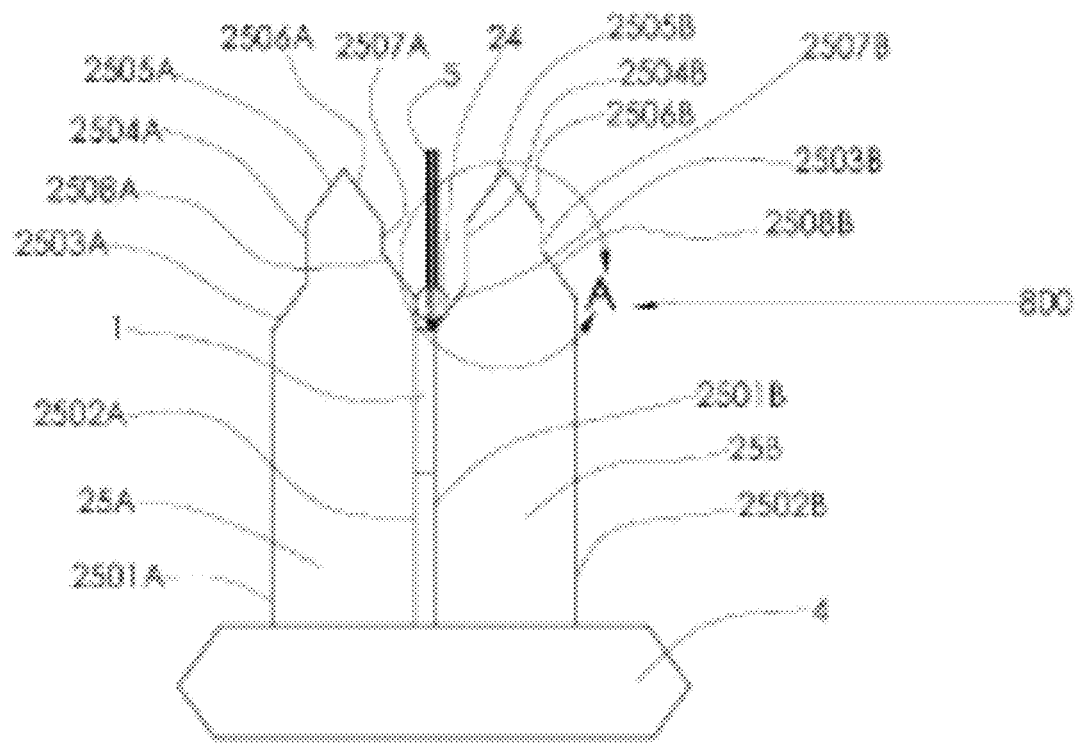
FIGS. 12 and 12A are each a side view of the apparatus shown in FIG. 4 according to another non-limiting illustrated embodiment.

FIG. 12 illustrates an apparatus 800 according to one non-limiting illustrated embodiment. The light emitter 1 is physically coupled between the first fin structure 25A and the second fin structure 25B, which are attached to the support plate 4. The first fin structure 25A has primary surfaces 2501A, 2502A and a second edge having sloped surfaces 2503A, 2505A, 2506A, 2508A. The second fin structure 25B has primary surfaces 2501B, 2502B and a second edge having sloped surfaces 2503B, 2505B, 2506B, 2508B. In one embodiment, the first and the second fin structures 25A, 25B are each made from a single-crystal silicon wafer and have symmetric shapes. At least a portion of some or all of the surfaces 2501A, 2502A, 2503A, 2504A, 2505A, 2506A, 2507A, 2508A of the first fin structure 25A and the surfaces 2501B, 2502B, 2503B, 2504B, 2505B, 2506B, 2507B, 2508B of the second fin structure 25B are metalized.

A collimating device 24 is attached to the vertical primary surface 2502A of the first fin structure 25A and the sloped surface 2503B of the second fin structure 25B. In one embodiment, the light emitter 1 is a laser diode bar that emits a laser beam 5. The laser beam 5 emits from one side of light emitter 1 as shown in FIG. 12 and propagates through the collimating device 24. With the collimating device 24 positioned and distanced appropriately from the light emitter 1, the laser beam 5 is properly collimated by the collimating device 24 in a direction away from the support plate 4. Since the laser beam 5 emits from one side of the light emitter 1, the first and the second fin structures 25A, 25B are constructed to catch the laser beam 5 at the center of the collimating device 24 as shown in FIG. 12. The centering of the laser beam 5 to the collimating device 24 is done by fabricating symmetric pieces of fin structures for the first and the second fin structures 25A, 25B. The slope and vertical wall holding the collimating device 24 in the first and the second fin structures 25A, 25B are designed to hold the collimating device 24 in a proper position for maintaining an optical working distance of the collimating device 24 to collimate the laser beam 5. Without proper location control of the collimating device 24, the laser beam 5 cannot be properly collimated. It is therefore important to fabricate and assemble the apparatus 800 with tight precision to maintain good collimation or to fix the divergence of the laser beam 5.

Figure 12A:
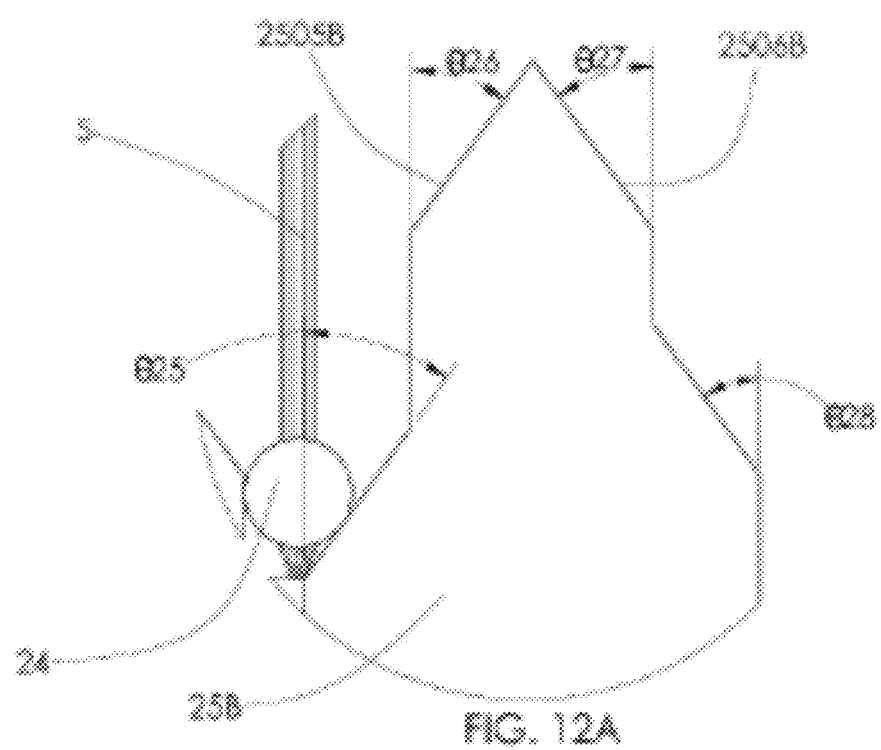

FIG. 12A illustrates an enlarged section A of FIG. 12. As shown in FIG. 12A, the collimating device 24 rests on the second edges of the first and the second fin structures 25A, 25B. The second edges of the first and the second fin structures 25A, 25B are chemically etched to produce angles θ25, θ26 as measured from one of primary surfaces and angles θ27, θ28 as measured from the other primary surface, where θ25, θ26, θ27, θ28 may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 25A, 25B is designed so that the sloped surfaces can hold the collimating device 24 in proper position for maintaining an optical working distance so that the collimating device 24 collimates the laser beam 5.

Figure 13:
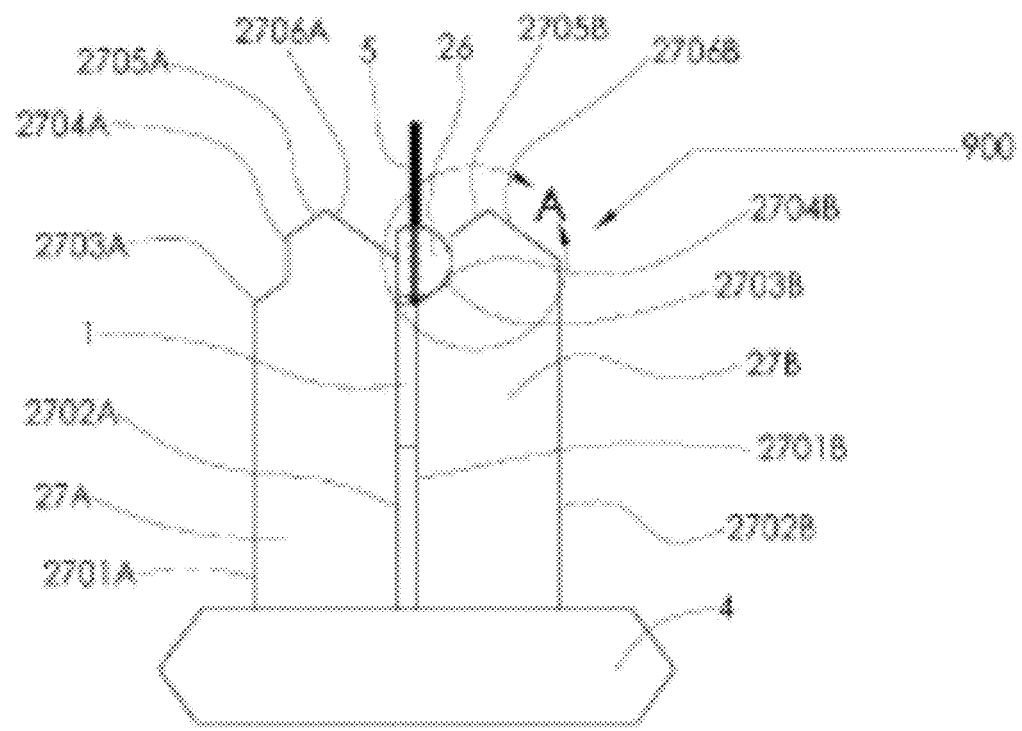
FIGS. 13 and 13A are each a side view of the apparatus shown in FIG. 4 according to another non-limiting illustrated embodiment.

FIG. 13 illustrates an apparatus 900 according to one non-limiting illustrated embodiment. The light emitter 1 is physically coupled between the first fin structure 27A and the second fin structure 27B, which are attached to the support plate 4. The first fin structure 27A has primary surfaces 2701A, 2702A and a second edge having sloped surfaces 2703A, 2705A, 2706A. The second fin structure 27B has primary surfaces 2701B, 2702B and a second edge having sloped surfaces 2703B, 2705B, 2706B. In one embodiment, the first and the second fin structures 27A, 27B are each made from a single-crystal silicon wafer and have symmetric shapes. At least a portion of some or all of the surfaces 2701A, 2702A, 2703A, 2704A, 2705A, 2706A of the first fin structure 27A and the surfaces 2701B, 2702B, 2703B, 2704B, 2705B, 2706B of the second fin structure 27B are metalized.

Figure 13A:
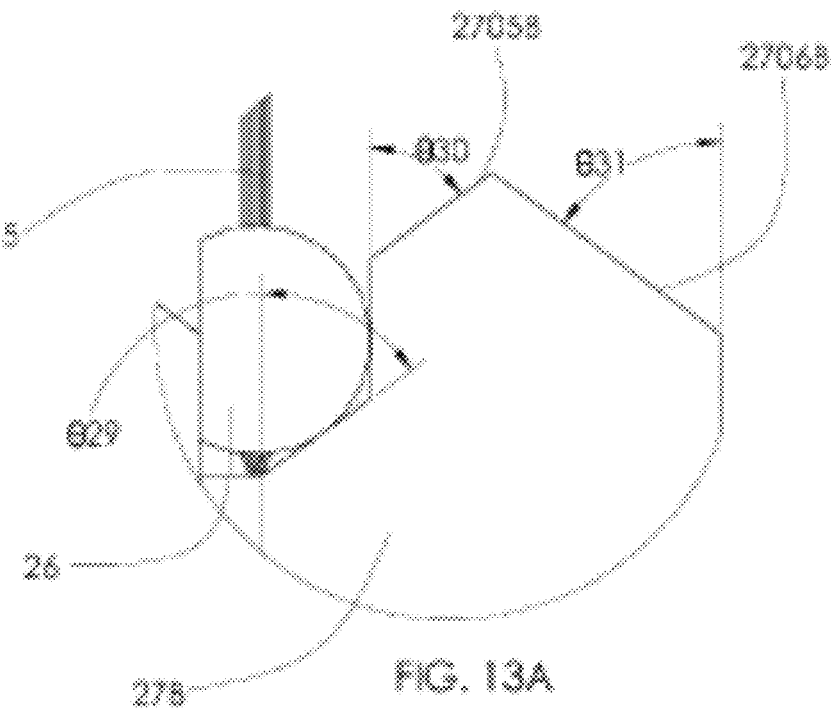

A collimating device 26 is attached to the vertical primary surface 2702A of the first fin structure 27A and the sloped surface 2703B and vertical surface 2704B of the second fin structure 27B. In one embodiment, the light emitter 1 is a laser diode bar that emits a laser beam 5. The laser beam 5 emits from one side of light emitter 1 as shown in FIG. 13 and propagates through the collimating device 26. As shown in FIGS. 13 and 13A, the collimating device 26 is a rod lens having one substantially flat surface along a longitudinal axis of the rod lens so that, by design, the collimating device 26 can fit between the first and the second fin structures 27A, 27B and be positioned to collimate the laser beam 5. With the collimating device 26 positioned and distanced appropriately from the light emitter 1, the laser beam 5 is properly collimated by the collimating device 26 in a direction away from the support plate 4. Since the laser beam 5 emits from one side of the light emitter 1, the first and the second fin structures 27A, 27B are constructed to catch the laser beam 5 at the center of the collimating device 26 as shown in FIG. 13. The centering of the laser beam 5 to the collimating device 26 is done by fabricating symmetric pieces of fin structures for the first and the second fin structures 27A, 27B. The slope and vertical wall holding the collimating device 26 in the first and the second fin structures 27A, 27B are designed to hold the collimating device 26 in a proper position for maintaining an optical working distance of the collimating device 26 to collimate the laser beam 5. Without proper location control of the collimating device 26, the laser beam 5 cannot be properly collimated. It is therefore important to fabricate and assemble the apparatus 900 with tight precision to maintain good collimation or to fix the divergence of the laser beam 5.

FIG. 13A illustrates an enlarged section A of FIG. 13. As shown in FIG. 13A, the collimating device 26 rests on the second edges of the first and the second fin structures 27A, 27B. The second edges of the first and the second fin structures 27A, 27B are chemically etched to produce angles θ29, θ30 as measured from one of primary surfaces and an angle θ31 as measured from the other primary surface, where θ29, θ30, θ31 may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 27A, 27B is designed so that the sloped surfaces can hold the collimating device 26 in proper position for maintaining an optical working distance so that the collimating device 26 collimates the laser beam 5.

Figure 14:
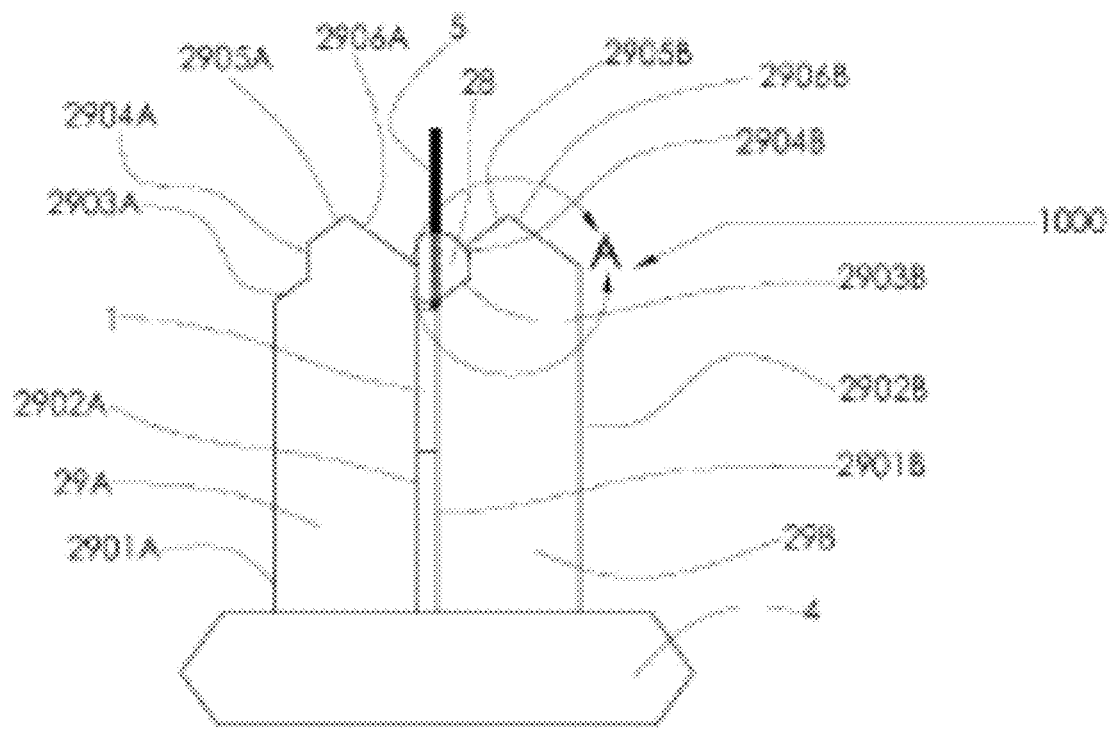
FIGS. 14 and 14A are each a side view of the apparatus shown in FIG. 4 according to another non-limiting illustrated embodiment.

FIG. 14 illustrates an apparatus 1000 according to one non-limiting illustrated embodiment. The light emitter 1 is physically coupled between the first fin structure 29A and the second fin structure 29B, which are attached to the support plate 4. The first fin structure 29A has primary surfaces 2901A, 2902A and a second edge having sloped surfaces 2903A, 2905A, 2906A. The second fin structure 29B has primary surfaces 2901B, 2902B and a second edge having sloped surfaces 2903B, 2905B, 2906B. In one embodiment, the first and the second fin structures 29A, 29B are each made from a single-crystal silicon wafer and have symmetric shapes. At least a portion of some or all of the surfaces 2901A, 2902A, 2903A, 2904A, 2905A, 2906A of the first fin structure 29A and the surfaces 2901B, 2902B, 2903B, 2904B, 2905B, 2906B of the second fin structure 29B are metalized.

Figure 14A:
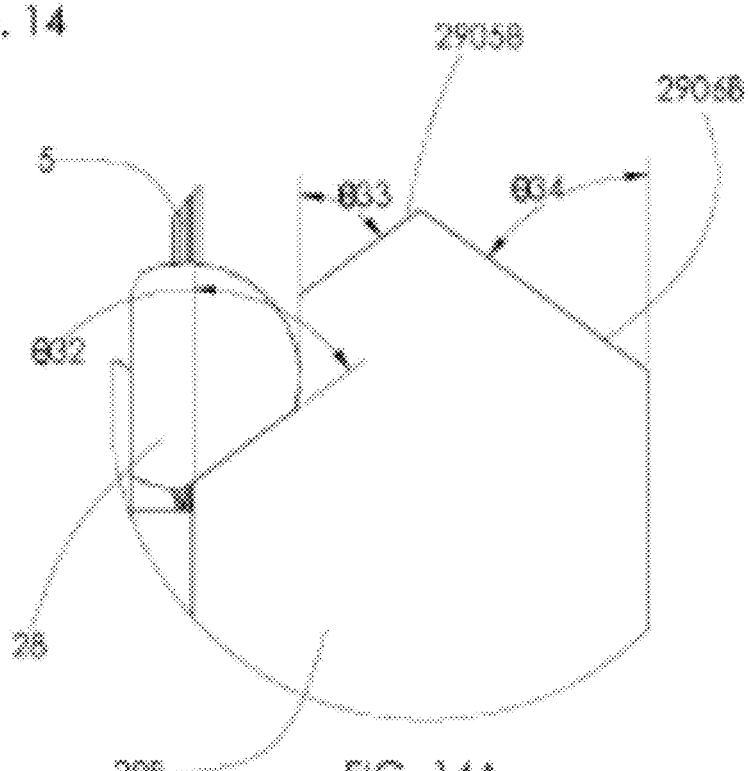

A collimating device 28 is attached to the vertical primary surface 2902A of the first fin structure 29A and the sloped surface 2903B and vertical surface 2904B of the second fin structure 29B. In one embodiment, the light emitter 1 is a laser diode bar that emits a laser beam 5. The laser beam 5 emits from one side of light emitter 1 as shown in FIG. 14 and propagates through the collimating device 28. As shown in FIGS. 14 and 14A, the collimating device 28 is a rod lens having two substantially flat surfaces along a longitudinal axis of the rod lens so that, by design, the collimating device 28 can fit between the first and the second fin structures 29A, 29B and be positioned to collimate the laser beam 5. With the collimating device 28 positioned and distanced appropriately from the light emitter 1, the laser beam 5 is properly collimated by the collimating device 28 in a direction away from the support plate 4. Since the laser beam 5 emits from one side of the light emitter 1, the first and the second fin structures 29A, 29B are constructed to catch the laser beam 5 at the center of the collimating device 28 as shown in FIG. 14. The centering of the laser beam 5 to the collimating device 28 is done by fabricating symmetric pieces of fin structures for the first and the second fin structures 29A, 29B. The slope and vertical wall holding the collimating device 28 in the first and the second fin structures 29A, 29B are designed to hold the collimating device 28 in a proper position for maintaining an optical working distance of the collimating device 28 to collimate the laser beam 5. Without proper location control of the collimating device 28, the laser beam 5 cannot be properly collimated. It is therefore important to fabricate and assemble the apparatus 1000 with tight precision to maintain good collimation or to fix the divergence of the laser beam 5.

FIG. 14A illustrates an enlarged section A of FIG. 14. As shown in FIG. 14A, the collimating device 28 rests on the second edges of the first and the second fin structures 29A, 29B. The second edges of the first and the second fin structures 29A, 29B are chemically etched to produce angles θ32, θ33 as measured from one of primary surfaces and an angle θ34 as measured from the other primary surface, where θ32, θ33, θ34 may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 29A, 29B is designed so that the sloped surfaces can hold the collimating device 28 in proper position for maintaining an optical working distance so that the collimating device 28 collimates the laser beam 5.

Figure 15:
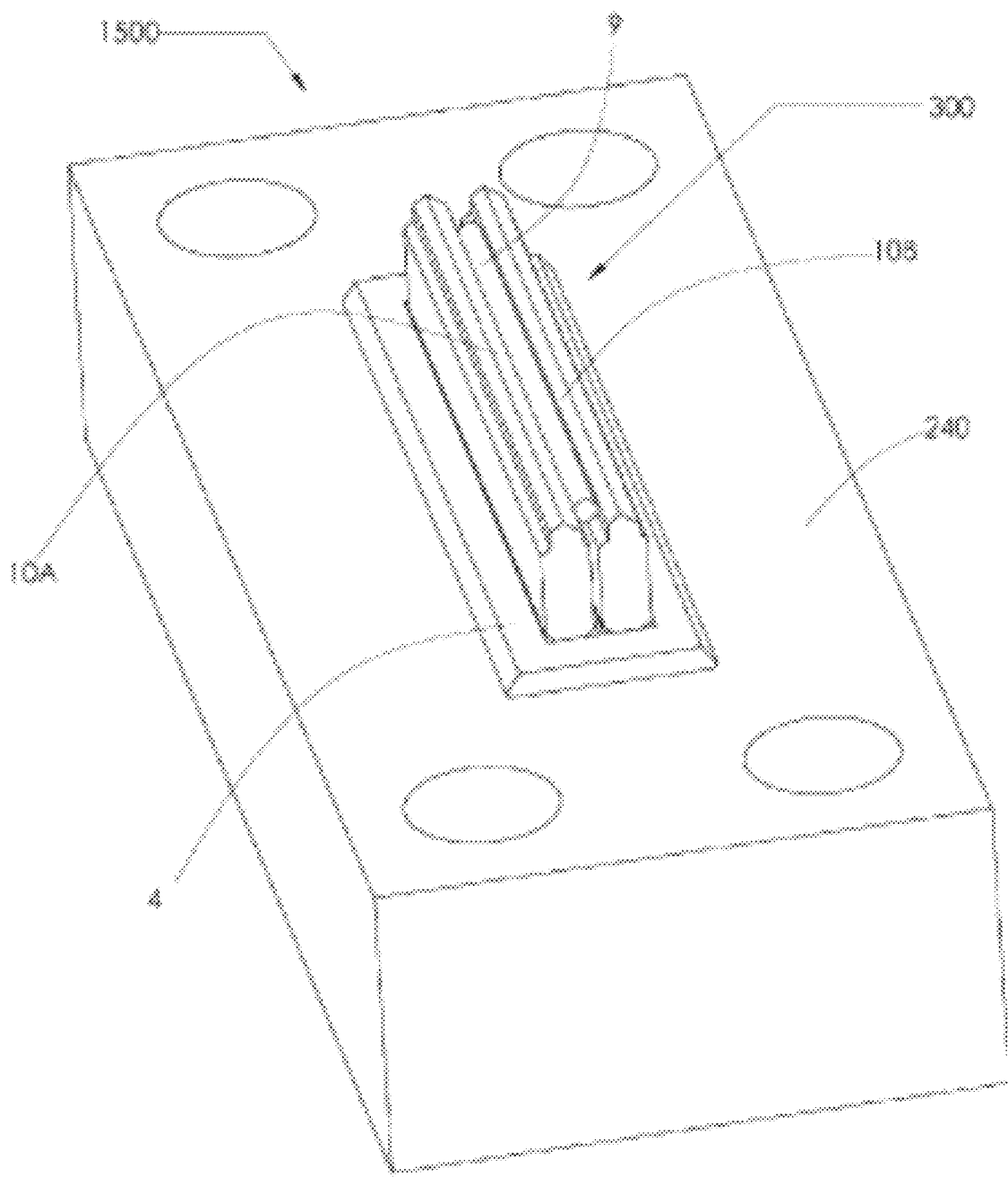
FIG. 15 is a diode laser package according to one non-limiting illustrated embodiment.

FIG. 15 illustrates a diode laser package 1500 according to one non-limiting illustrated embodiment. The package 1500 includes the apparatus 300 and a mounting fixture 240. In other embodiments, instead of the apparatus 300, the package 1500 may include any one of the apparatus 100, apparatus 200, apparatus 400, apparatus 500, apparatus 600, apparatus 700, apparatus 800, apparatus 900, and apparatus 1000. The apparatus 300 is mounted on the mounting fixture 240, and the package 1500 can be further integrated into a system not illustrated. For example, the mounting fixture 240 may be a manifold with fluid channels therein for a cooling fluid, such as water, to flow through the mounting fixture 240 to provide cooling of the apparatus 300 or, more specifically, cooling of the light emitter 1 in the apparatus 300. FIG. 15 shows an integration of the collimating device 9 in a silicon-etched diode laser package that includes the silicon-based first and the second fin structures 10A, 10B, the silicon-based support plate 4, and the light emitter 1. The design of the first and second fin structures 10A, 10B and the support plate 4 provides great flexibility, simplicity, and repeatability in the integration of the collimating device 9 into the apparatus 300. Thus, such novel design enables the mass production of diode laser packages such as the package 1500 with a great degree of precision for a variety of laser applications.

Figure 16:
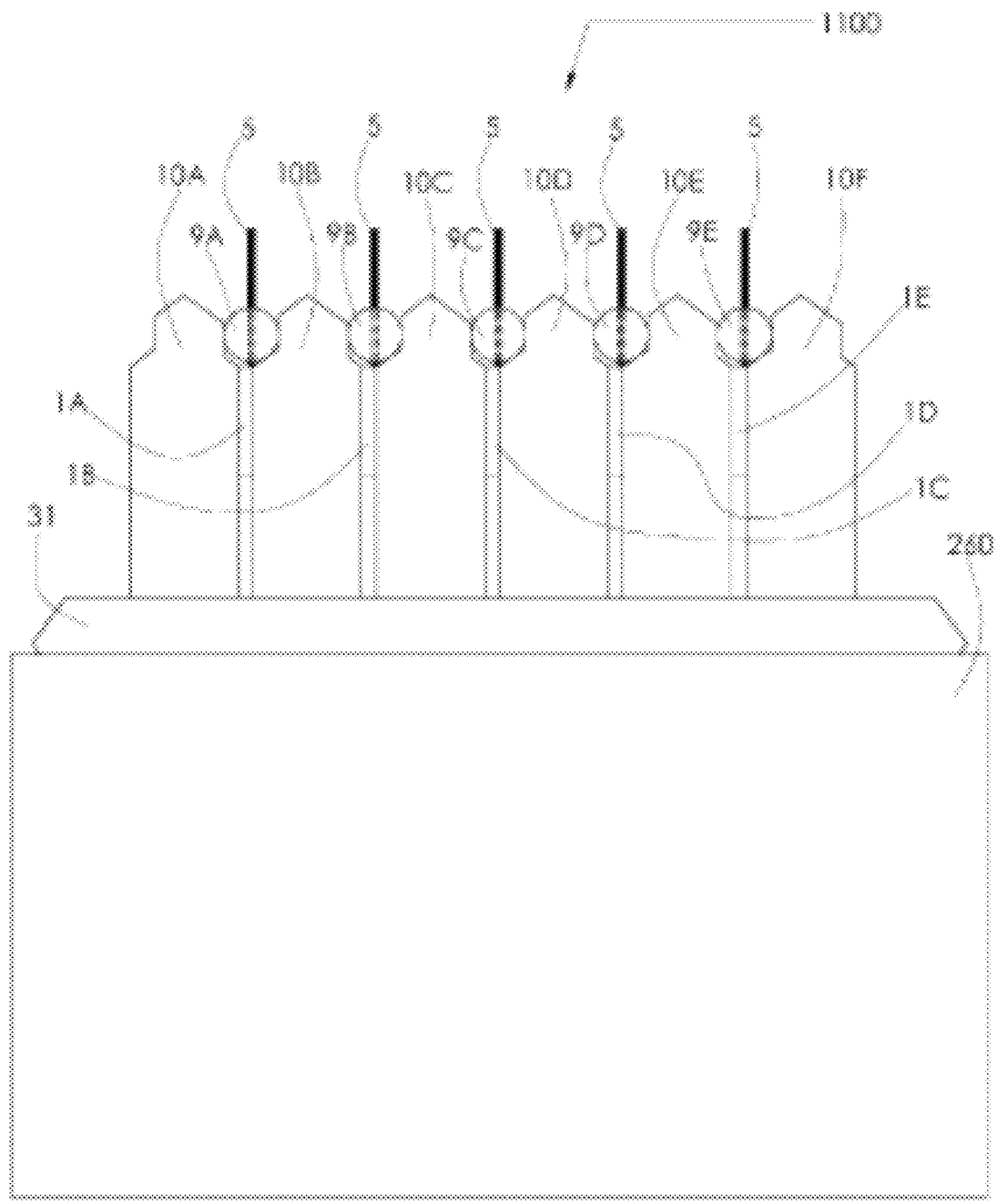
FIG. 16 a multi-emitter apparatus according to one non-limiting illustrated embodiment.
Figure 17:
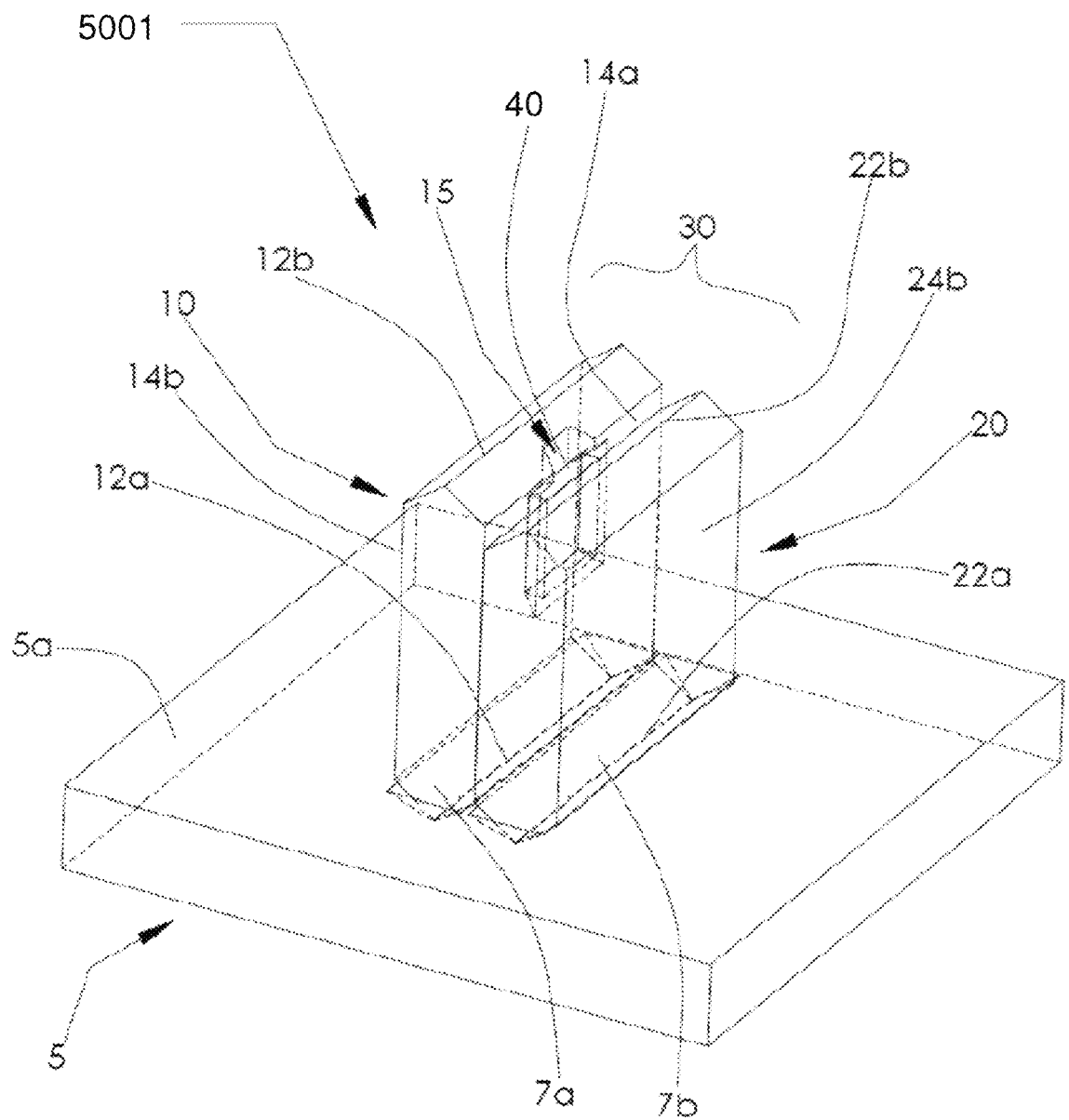
FIG. 17 is a perspective view of a silicon-based thermal energy transfer apparatus that aids dissipation of thermal energy from a heat-generating device in accordance with a first embodiment of the present disclosure.
Figure 18:
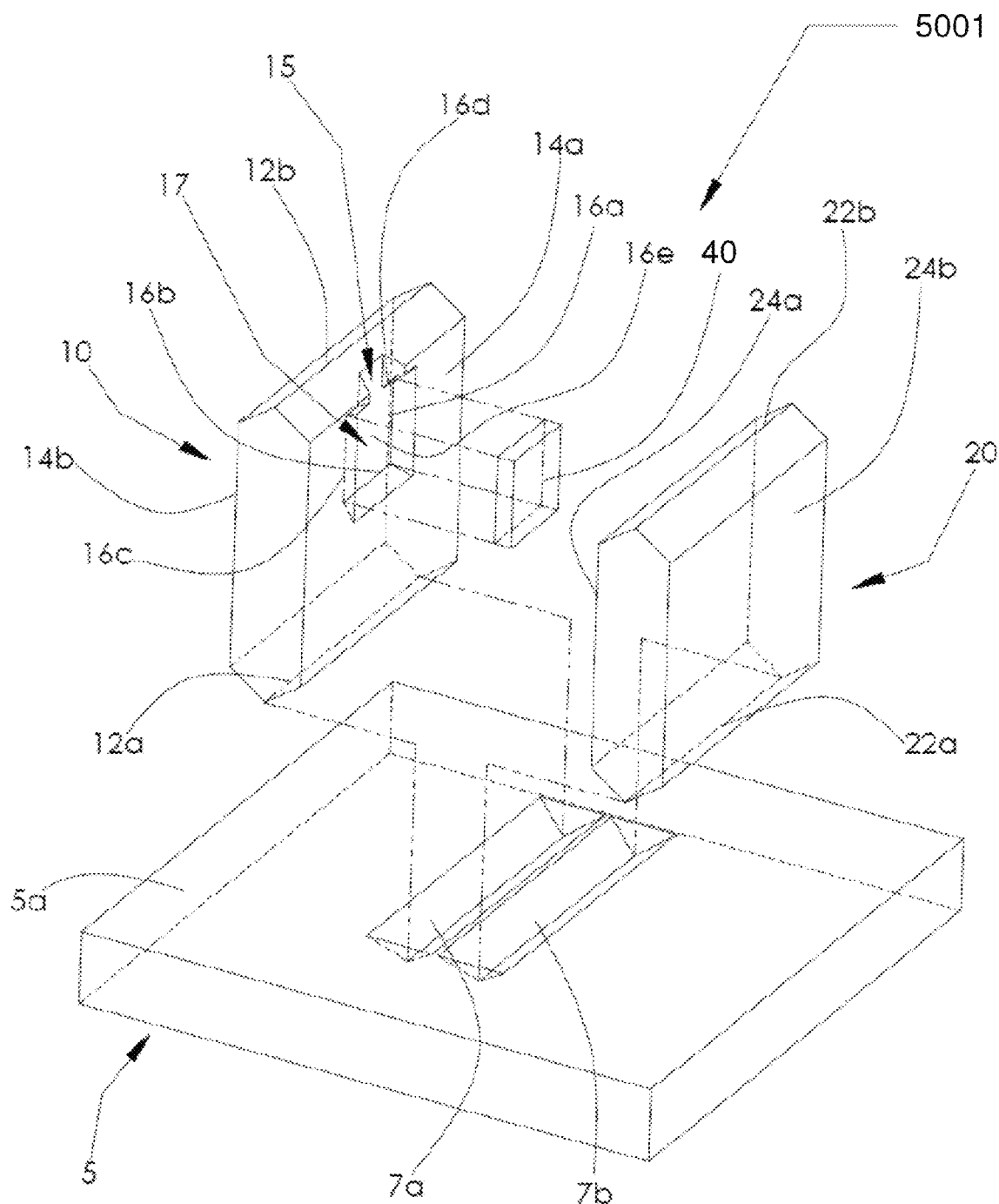
FIG. 18 is an exploded view of the silicon-based thermal energy transfer apparatus of FIG. 17.
Figure 19:
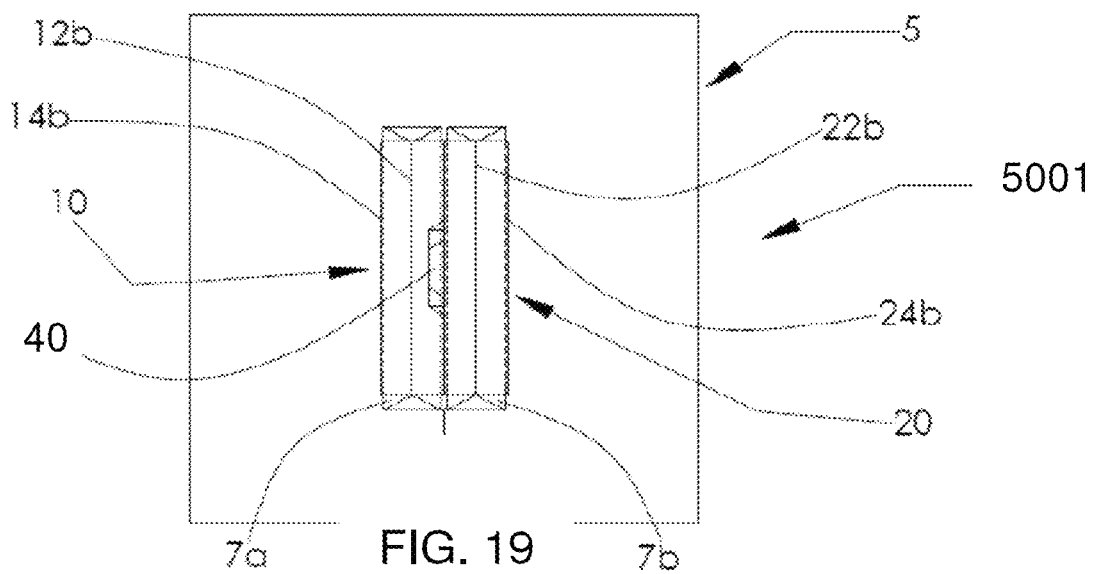
FIG. 19 is a top view of the silicon-based thermal energy transfer apparatus of FIG. 17.
Figure 20:
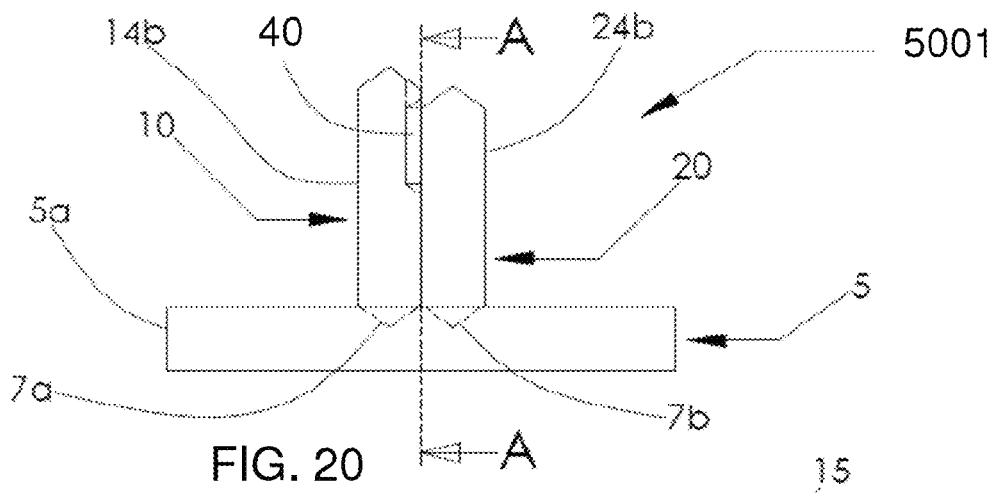
FIG. 20 is a front view of the silicon-based thermal energy transfer apparatus of FIG. 17.
Figure 21:
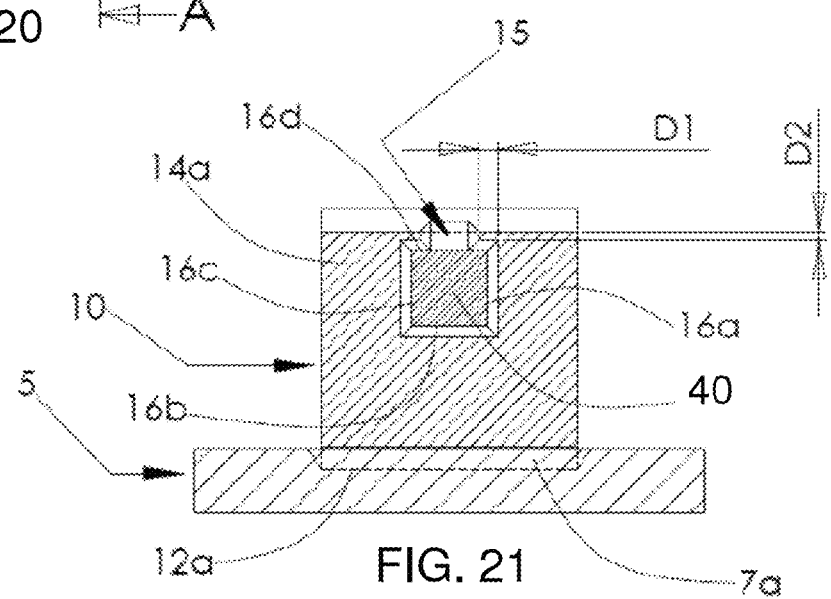
FIG. 21 is a cross-sectional view of the silicon-based thermal energy transfer apparatus along line AA of FIG. 20.
Figure 22:
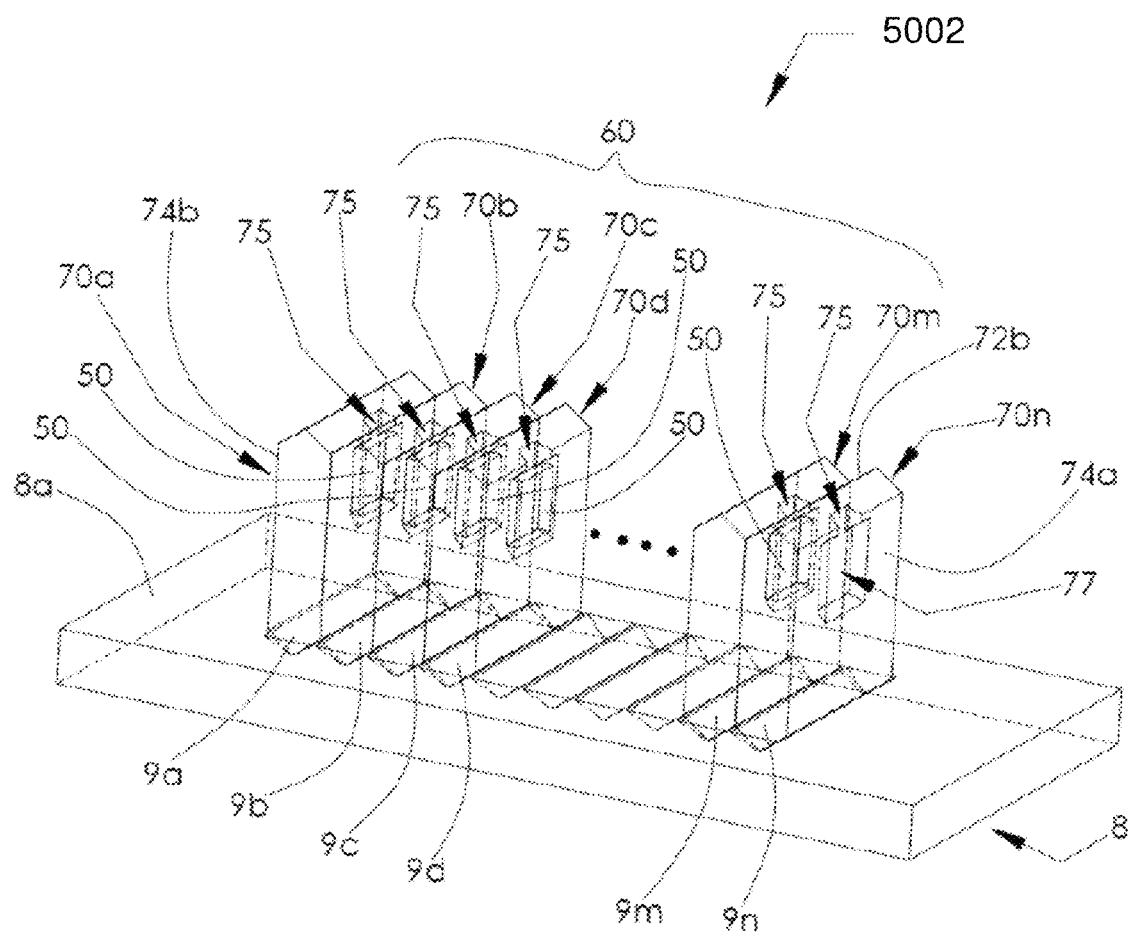
FIG. 22 is a perspective view of a silicon-based thermal energy transfer apparatus that aids dissipation of thermal energy from a plurality of heat-generating devices in accordance with a second embodiment of the present disclosure.
Figure 23:
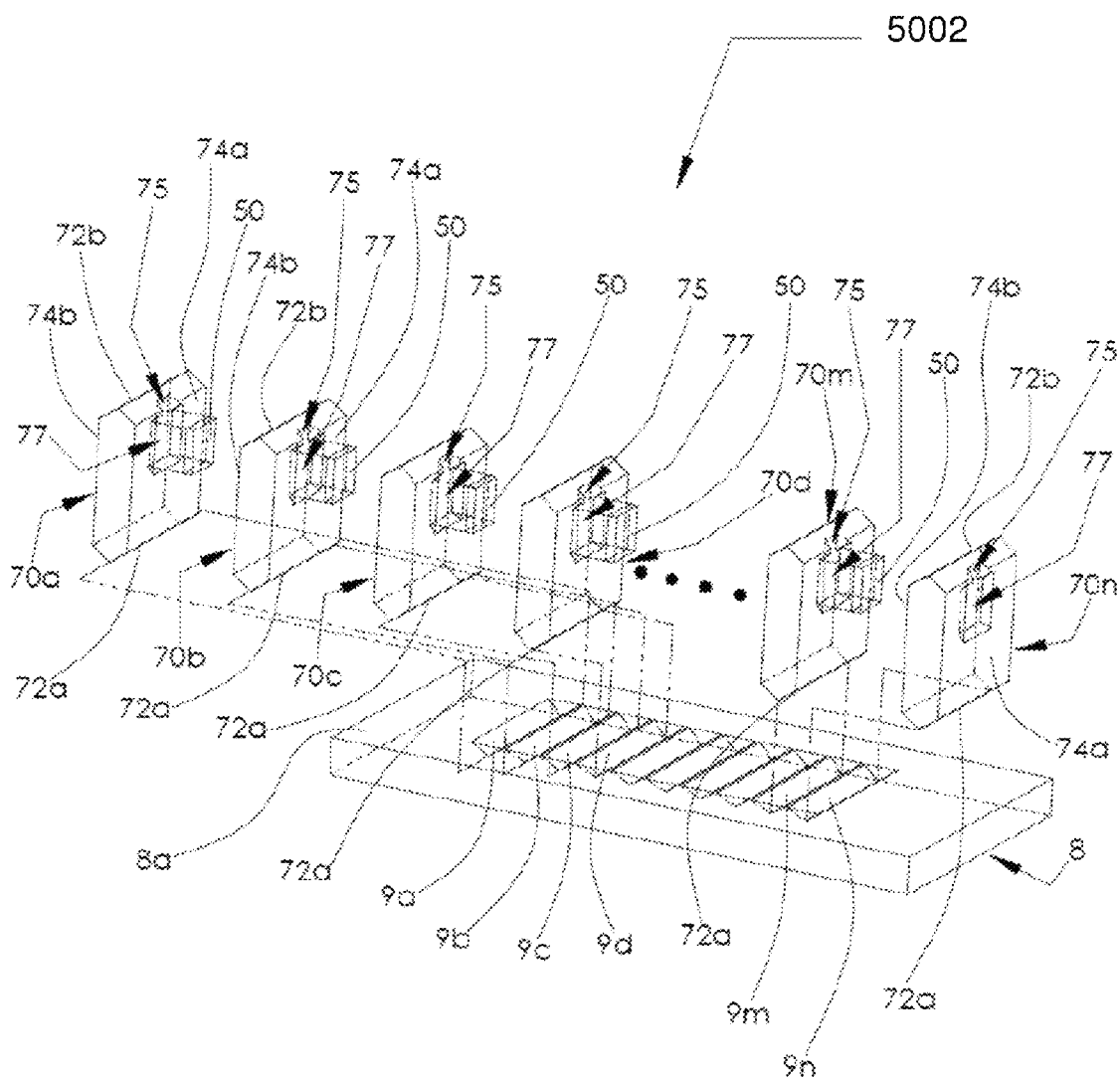
FIG. 23 is an exploded view of the silicon-based thermal energy transfer apparatus of FIG. 22.
Figure 24:
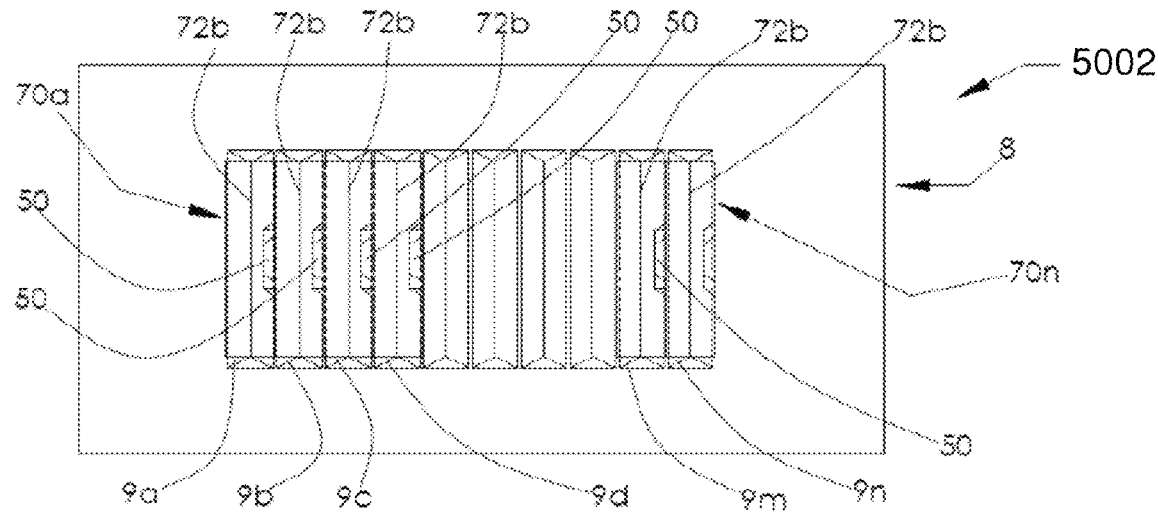
FIG. 24 is a top view of the silicon-based thermal energy transfer apparatus of FIG. 22.
Figure 25:
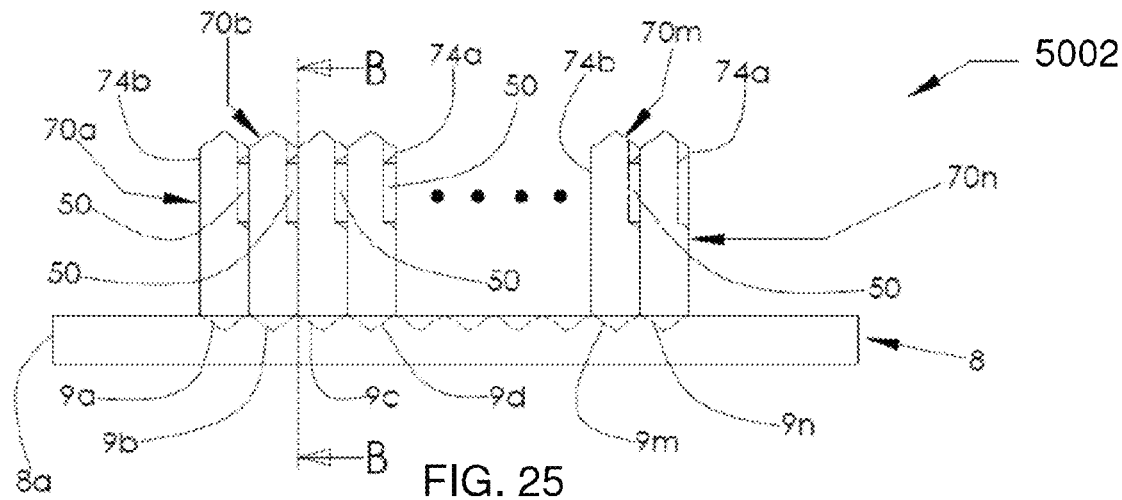
FIG. 25 is a front view of the silicon-based thermal energy transfer apparatus of FIG. 22.
Figure 26:
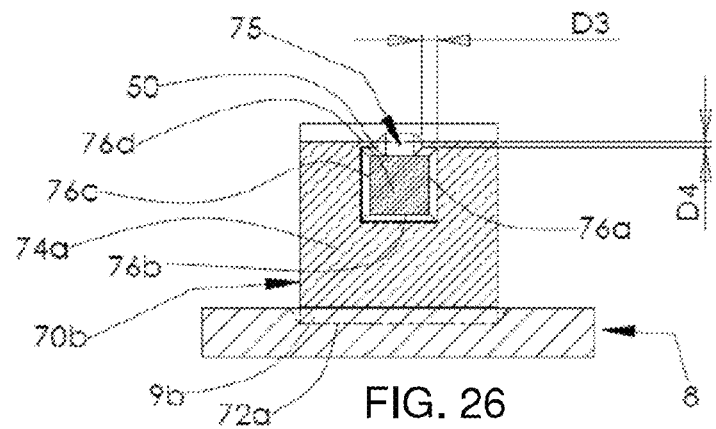
FIG. 26 is a cross-sectional view of the silicon-based thermal energy transfer apparatus along line BB of FIG. 25.
Figure 27:
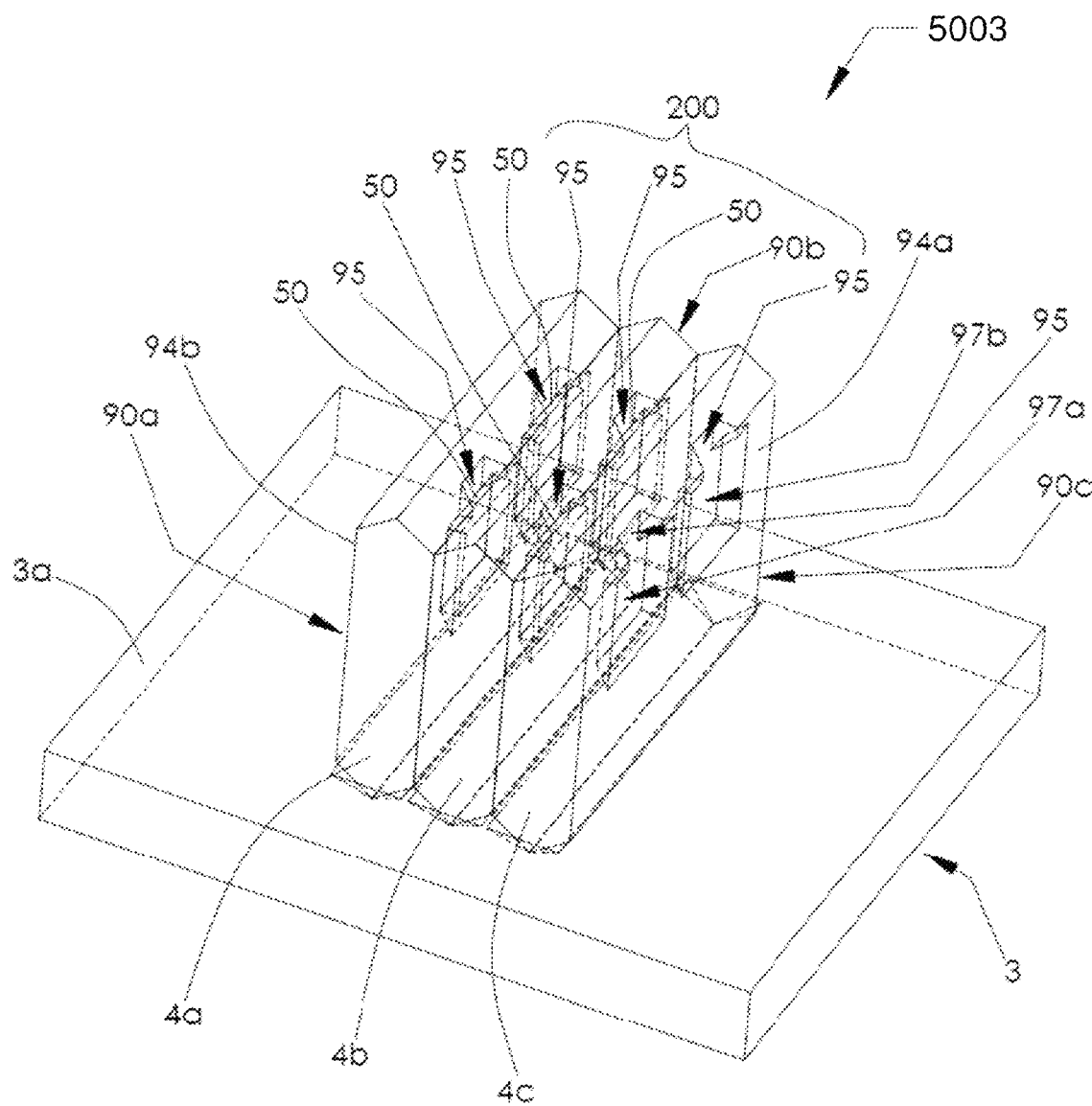
FIG. 27 is a perspective view of a silicon-based thermal energy transfer apparatus that aids dissipation of thermal energy from a plurality of heat-generating devices in accordance with a third embodiment of the present disclosure.
Figure 28:
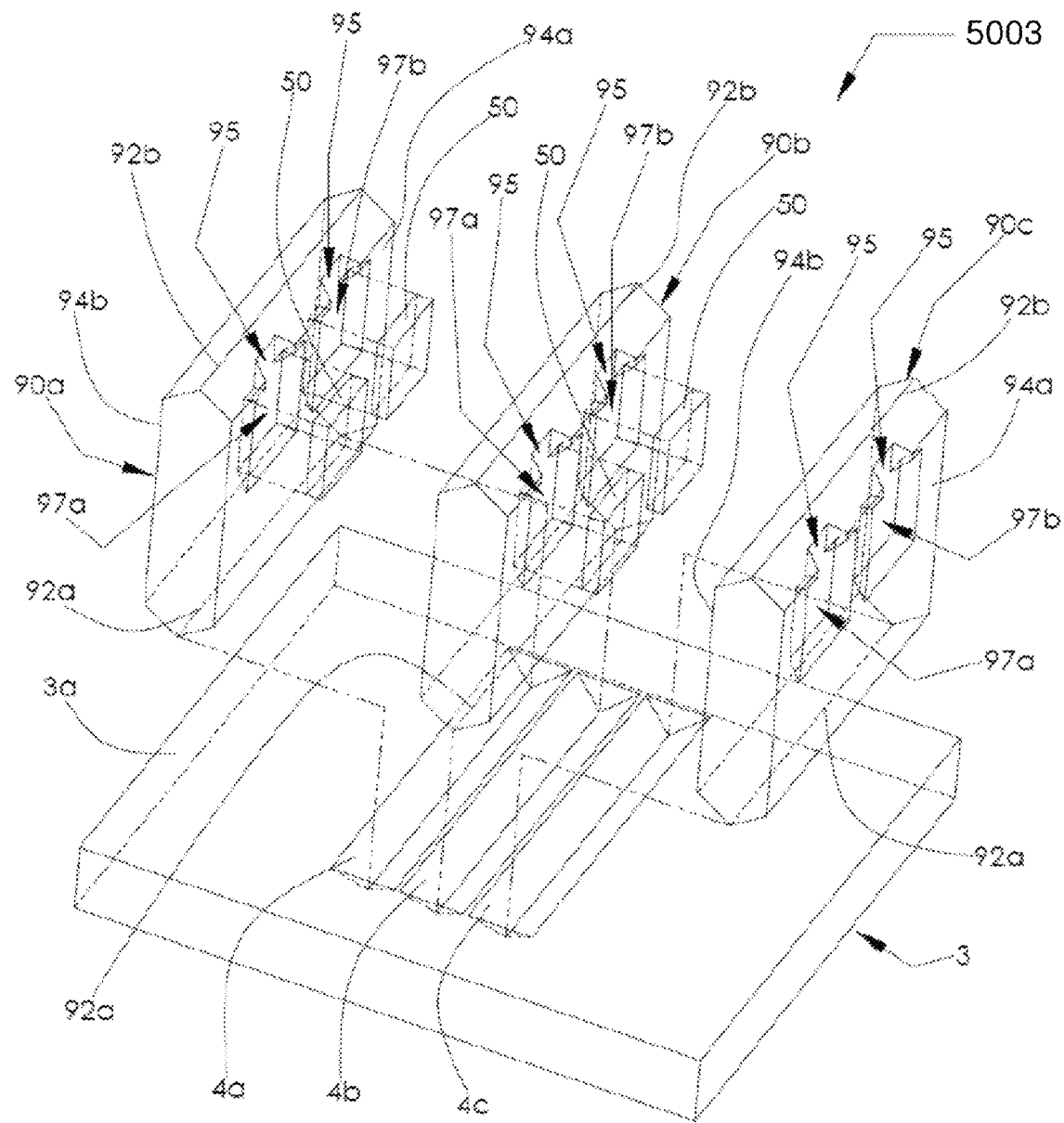
FIG. 28 is an exploded view of the silicon-based thermal energy transfer apparatus of FIG. 27.
Figure 29:
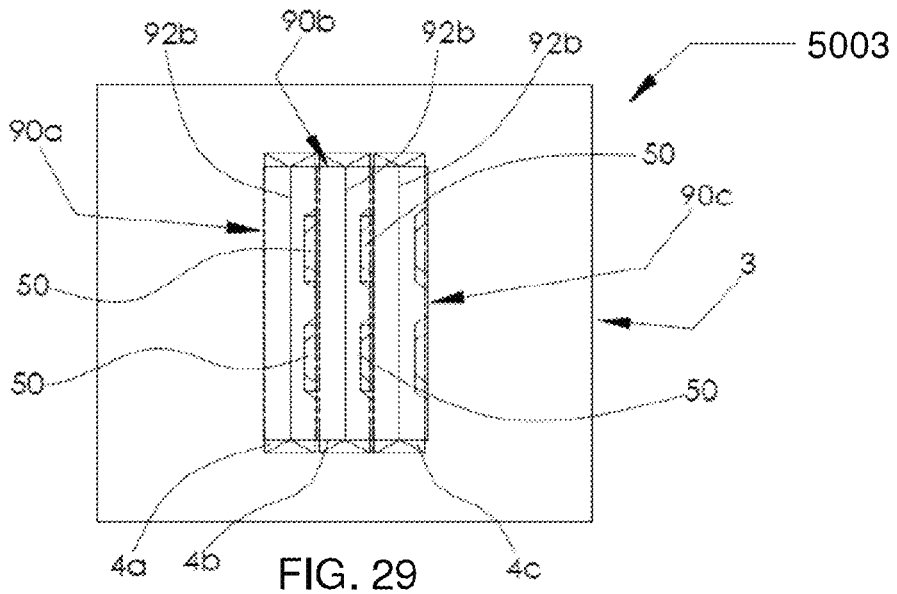
FIG. 29 is a top view of the silicon-based thermal energy transfer apparatus of FIG. 27.
Figure 30:
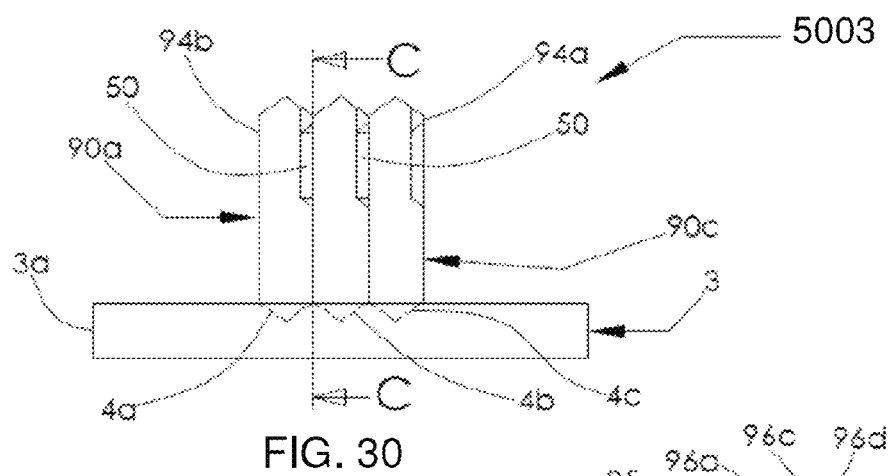
FIG. 30 is a front view of the silicon-based thermal energy transfer apparatus of FIG. 27.
Figure 31:
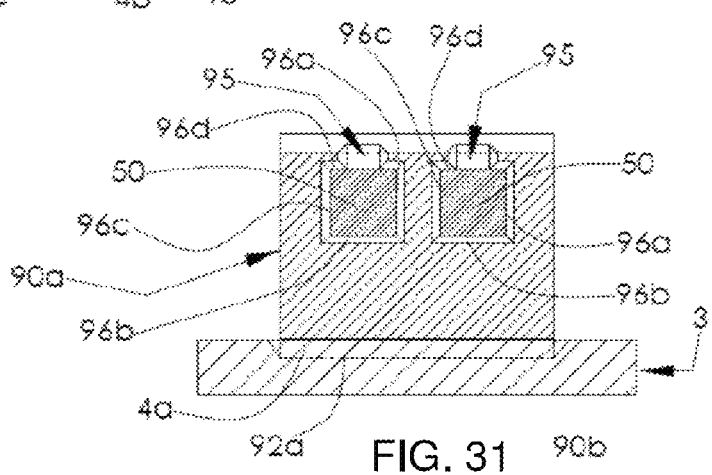
FIG. 31 is a cross-sectional view of the silicon-based thermal energy transfer apparatus along line CC of FIG. 30.
Figure 32:
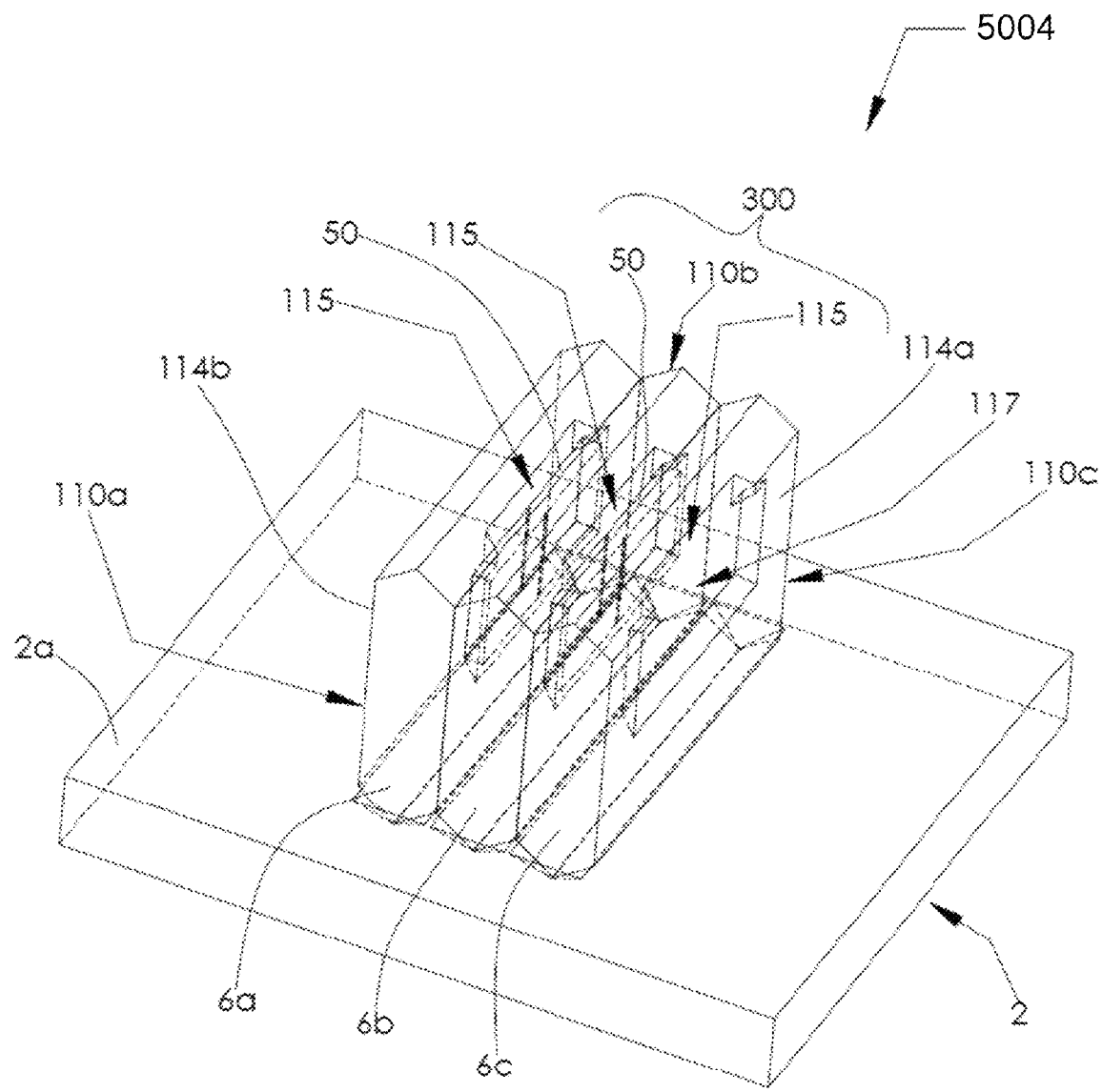
FIG. 32 is a perspective view of a silicon-based thermal energy transfer apparatus that aids dissipation of thermal energy from a plurality of heat-generating devices in accordance with a fourth embodiment of the present disclosure.
Figure 33:
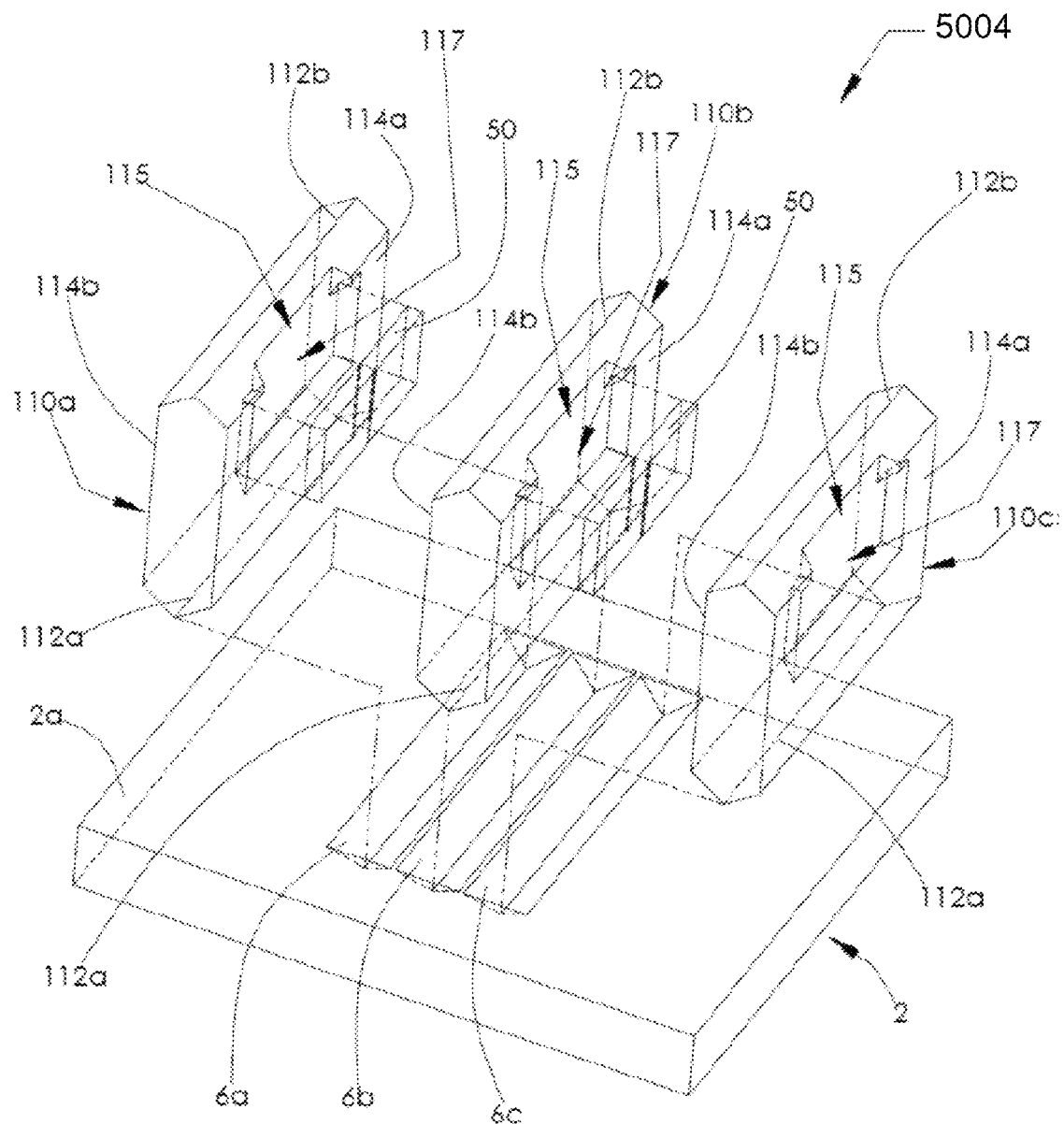
FIG. 33 is an exploded view of the silicon-based thermal energy transfer apparatus of FIG. 32.
Figure 34:
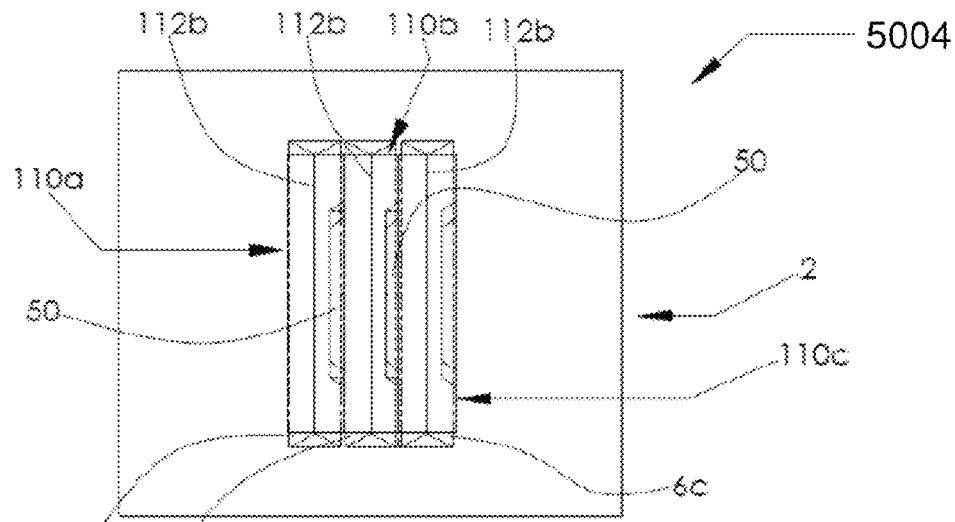
FIG. 34 is a top view of the silicon-based thermal energy transfer apparatus of FIG. 32.
Figure 35:
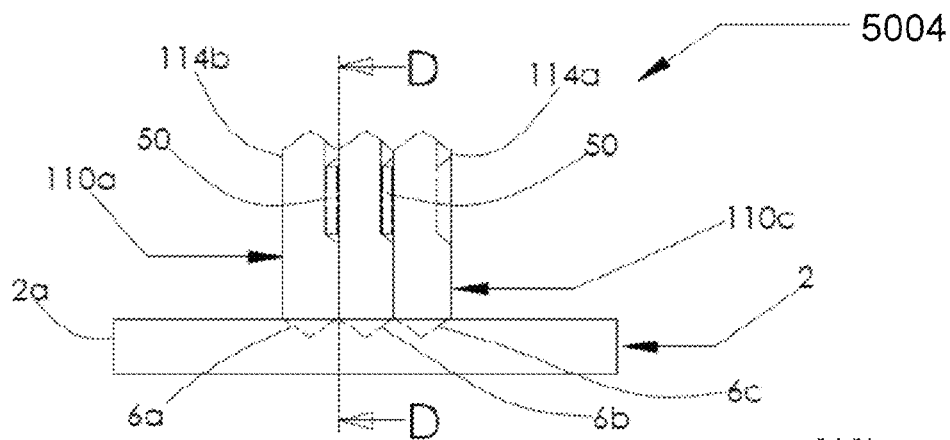
FIG. 35 is a front view of the silicon-based thermal energy transfer apparatus of FIG. 32.
Figure 36:
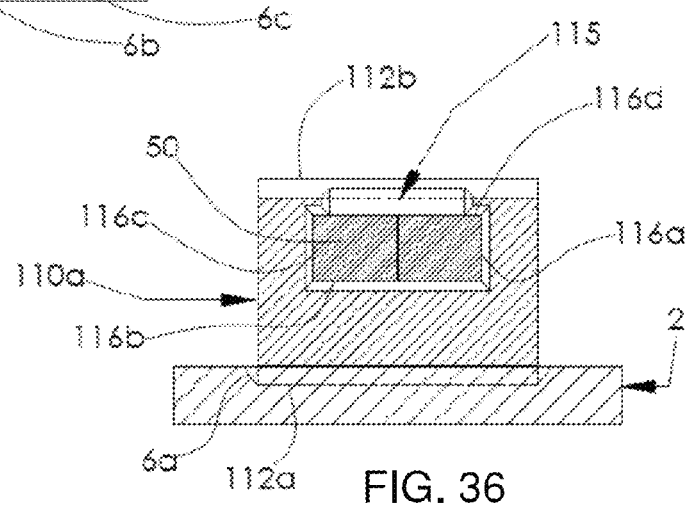
FIG. 36 is a cross-sectional view of the silicon-based thermal energy transfer apparatus along line DD of FIG. 35.

FIG. 16 illustrates a multi-emitter apparatus 1100 according to one non-limiting illustrated embodiment. The apparatus 1100 includes a support plate 31 and a plurality of fin structures 10A, 10B, 10C, 10D, 10E, 10F that are attached to the support plate 31. The apparatus 1100 includes a plurality of light emitters, namely light emitters 1A, 1B, 1C, 1D, 1E. In one embodiment, the light emitters 1A, 1B, 1C, 1D, 1E are diode lasers and each of which emits a respective laser beam 5 in a direction away from the support plate 31 when mounted in place as shown in FIG. 16. The light emitters 1A, 1B, 1C, 1D, 1E are respectively physically coupled between the fin structures 10A, 10B, 10C, 10D, 10E, 10F. In one embodiment, the apparatus 1100 also includes a mounting fixture 260, to which the support plate 31 is physically coupled or otherwise attached to as shown in FIG. 16. The mounting fixture 260 may be a manifold with fluid channels therein for a cooling fluid, such as water, to flow through the mounting fixture 260 to provide cooling of the apparatus 1100 or, more specifically, cooling of the light emitters 1A, 1B, 1C, 1D, 1E in the apparatus 1100. The apparatus 1100 also includes a plurality of collimating devices 9A, 9B, 9C, 9D, 9E. Each of the collimating devices 9A, 9B, 9C, 9D, 9E may be a rod lens and is precisely placed so that the laser beam 5 propagates through the center of the rod lens. Although a number of five light emitters are shown in FIG. 16, in other embodiments the number of light emitters, fin structures, and collimating devices vary, and the size of the support plate 31 can vary accordingly to accommodate the desired number of light emitters. The use of silicon etched structure such as the fin structures 10A, 10B, 10C, 10D, 10E, 10F and the support plate 31 allow simple, repeatable, and precise assembly of the apparatus 1100. The precision collimation and compact packaging can increase the radiance of the diode lasers as well as improve the manufacturability and performance while enabling mass production.

Thus, embodiments of the present disclosure include design schemes for a silicon-based micro-machined lens mounting structure that uses kinematic alignment of a collimating lens such as a rod lens or a high numerical aperture lens. Several alignment schemes are developed to align the collimating lens in a silicon-based support structure, and the collimating lens is placed in the support structure to align the collimating lens to within a few microns of tolerance. The support structure is constructed by bonding two pieces of silicon etched structures to a silicon-based support plate. This support structure permits control of the tolerance error in the silicon micro-etching and the collimating lens specification. Also, other mounting features are micro-etched on the slope of the fin structures for registering the collimating lens to align the collimating lens kinematically. This process allows controlling the mechanical tolerance of the fabricated silicon-based structure to securely position the collimating lens for the UV-curing epoxy or soldering process.

Another advantage of the inventive concept disclosed herein is that it allows one to easily assemble the collimating lens due to a novel design of the kinematic alignment structure. The collimating lens can be placed in an assembly fixture to allow for passively alignment of the diode laser for perfect collimation of the diode laser beam. Two silicon-based fin structures are etched to fabricate a monolithic structure as the mounting structure for a diode laser and a collimating lens. The structures include a vertical or sloped wall that comes naturally from the anisotropic etching process of a <100> or <110> single-crystal silicon wafer. The <100> plane of a single-crystal silicon wafer produces a 54.7-degree angle with the <111> plane of a single-crystal silicon wafer in a face plane of the <100> single-crystal silicon wafer. The <110> plane of the single-crystal silicon wafer can be etched to result in a 35.5-degree angle with the <111> plane of the single-crystal silicon wafer in a face plane of <110> single-crystal silicon wafer. These sloped walls are bonded together to make a groove for the collimating lens. Then, the collimating lens can be dropped in a grooved channel for kinematically aligning the collimating lens. The lens can be actively aligned while the lens is in the groove by using an alignment tool. Since the support structure has kinematic functionality, the lens can be securely positioned for better performance over many thermal cycles of the epoxy or solder bonding.

Due to the monolithic design of the collimating lens mounting, the design of diode laser package is simple and easy to assemble. Most of the current collimation schemes use a separate lens mounting structure to attach the collimating lens, and then the lens mounting structure is mounted on the diode laser package. In this case, perfect alignment of all diode lasers is not feasible and strong radiance is impaired by misalignment of the multi-diode laser stack. To improve the radiance of the multi-diode laser stack, another mounting scheme was developed to align all diode lasers individually for a perfect alignment. However, this alignment process becomes cumbersome in the manufacturing process when the quantity of diode lasers in the multi-diode stack package grows to 10 stacks or more. It is believed that the inventive concept disclose herein addresses the problems associated with previous alignment techniques and improves the brightness of the diode laser package.

Overview of Thermal Transfer for Compact Heat-Generating Devices

Embodiments of a silicon-based thermal energy transfer apparatus that aids dissipation of thermal energy from a heat-generating device are described herein. The disclosed silicon-based thermal energy transfer apparatus is configured with a recess for receiving a heat-generating device, such as an edge-emitting laser diode, and an opening. The recess is sized and shaped so that the laser diode can tightly fit in and be received in the recess. The opening allows light emitted by the edge-emitting laser diode to exit the thermal energy transfer apparatus and travel along a predetermined direction. Thus, the proposed design provides passive alignment of the laser diode, thereby significantly reducing the time that would be required to align the laser diode in assembly the thermal energy transfer apparatus with the laser diode received therein. This advantageously saves time and cost associated with the manufacturing of the thermal energy transfer apparatus. The recesses will enable the assembly and alignment of the laser diodes to be faster than a conventional packaging method. Unlike some conventional assembly methods where alignment equipment is used to align the laser diodes during assembly, the recesses in accordance with the present disclosure enable passive alignment of the laser diodes where the laser diodes are aligned as they are placed in the recesses without the aid of any alignment equipment. Thus, the techniques described herein provide a better tolerance control in shorter assembly time. Advantageously, the techniques described herein can result in less assembly time, lower manufacturing cost and higher yield rate.

While aspects of the disclosed embodiments and techniques may be implemented in any number of different applications, for the purpose of illustration the disclosed embodiments are described in context of the following exemplary configurations.

The following description refers to FIGS. 17-36 of the present disclosure. Thus, although numeral references in some of the components shown in FIGS. 17-36 may be identical to certain numeral references used in FIGS. 1-16, each and every numeral reference identified hereinafter pertains to a respective component shown in FIGS. 17-36.

Various embodiments described hereinafter are applicable to each and every apparatus described above, such as those shown in and described above with respect to FIGS. 4-16.

ILLUSTRATIVE EMBODIMENTS

FIGS. 17-21 illustrate various views of a silicon-based thermal energy transfer apparatus 5001 that aids dissipation of thermal energy from a heat-generating device in accordance with an embodiment of the present disclosure.

As shown in FIGS. 17-21, the thermal energy transfer apparatus 5001 comprises a silicon-based base portion 5 having a first primary surface 5a. The thermal energy transfer apparatus 5001 further comprises a silicon-based support structure 30 having a mounting end and a distal end opposite the mounting end with the mounting end received by the base portion 5 such that the support structure 30 extends from the first primary surface 5a of the base portion 5. The support structure 30 includes a recess 17 defined therein to receive a heat-generating device 40. The support structure 30 further includes a slit connecting the distal end and the recess 17 to expose at least a portion of the heat-generating device 40. In the case that the heat-generating device 40 is an edge-emitting laser diode, the slit exposes a light-emitting edge of the edge-emitting laser diode when the edge-emitting laser diode is received in the support structure 30.

In some embodiments, a dimension of the slit that is horizontal with respect to the base portion 5 (e.g., width of the slit) is less than a dimension of the recess 17 that is horizontal with respect to the base portion 5 (e.g., width of the recess 17).

In some embodiments, the recess 17 is sized and shaped so that the heat-generating device 40 (e.g., an edge-emitting laser diode) is tightly received in the recess 17 when the heat-generating device 40 is received in the recess 17.

In some embodiments, the support structure 30 comprises a first fin portion 10 and a second fin portion 20. The base portion 5, first fin portion 10 and second fin portion 20 are made of silicon. In one embodiment, at least one of the base portion 5, first fin portion 10 and second fin portion 20 is made of single-crystal silicon. Alternatively, all of the base portion 5, first fin portion 10 and second fin portion 20 are made of single-crystal silicon. For example, the base portion 5, first fin portion 10 and second fin portion 20 may be made from a single-crystal silicon wafer using micro-electromechanical system (MEMS) fabrication process.

The base portion 5 has a first primary surface 5a. The first and second fin portions 10, 20 are received on the first primary surface 5a of the base portion 5 and extend longitudinally from the first primary surface 5a of the base portion 5. The first fin portion 10 includes a first primary end 12a received by the base portion 5 and a second primary end 12b opposite to the first primary end 12a of the first fin portion 10. The first fin portion 10 further includes a first primary surface 14a facing the second fin portion 20 and a second primary surface 14b opposite to the first primary surface 14a of the first fin portion 10. The first and second primary surfaces 14a, 14b of the first fin portion 10 extend between the first and second primary ends 12a, 12b of the first fin portion 10. The second fin portion 20 includes a first primary end 22a received by the base portion 5 and a second primary end 22b opposite to the first primary end 22a of the second fin portion 20. The second fin portion 20 further includes a first primary surface 24a facing the first fin portion 10 and a second primary surface 24b opposite to the first primary surface 24a of the second fin portion 20. The first and second primary surfaces 24a, 24b of the second fin portion 20 extend between the first and second primary ends 22a, 22b of the second fin portion 20. The first primary end 12a of the first fin portion 10 and the first primary end 22a of the second fin portion 20 together form the mounting end of the support structure 30. Likewise, the second primary end 12b of the first fin portion 10 and the second primary end 22b of the second fin portion 20 together form the distal end of the support structure 30.

The first primary surface 14a of the first fin portion 10 includes a recess 17 configured to receive the heat-generating device 40. As shown in FIGS. 17-21, the recess 17 has four sides 16a, 16b, 16c, 16d and a primary recess surface 16e. The primary recess surface 16e is generally parallel to the first primary surface 14a of the first fin portion 10. The first fin portion 10 further includes an opening 15 between the recess 17 and the second primary end 12b of the first fin portion 10 such that the primary recess surface 16e extends to the second primary end 12b of the first fin portion 10.

In some embodiments, a dimension of the opening 15 that is horizontal with respect to the base portion 5 (e.g., width of the opening 15) is less than a dimension of the recess 17 that is horizontal with respect to the base portion 5 (e.g., width of the recess 17).

The recess 17 and the opening 15 may be etched using any known or yet to be developed method including, but not limited to, dry etching for example.

In some embodiments, the recess 17 is sized and shaped to have at least two dimensions of the recess 17 along the primary recess surface 16e matching corresponding dimensions of the heat-generating device 40 so that the heat-generating device 40 is tightly received in the recess 17 when the heat-generating device 40 is received in the recess 17. For example, at least the width (e.g., sides 16b, 16d) and length (e.g., sides 16a, 16c) of the recess 17 may be sized to match the corresponding width and height of the heat-generating device 40. In some embodiments, at least two of the sides 16a, 16b, 16c, 16d of the recess 17 have sloped surface such that some or all of the dimensions of the recess 17 on the first primary surface 24a of the first fin portion 10 are larger than the corresponding dimensions of the recess 17 on the primary recess surface 16e. This form factor of the recess 17 advantageously allows the heat-generating device 40 to be simply placed in the recess 17 during the assembly process without the need of any alignment of the orientation of the heat-generating device 40 with respect to the thermal energy transfer apparatus 5001. In other words, the present disclosure allows passive alignment of the heat-generating device 40. When the heat-generating device 40 is an edge-emitting laser diode, during assembly it only needs to be placed in the recess 17 with its light-emitting edge on the side that is in contact with the primary recess surface 16e of the recess 17 and along the upper side (e.g., side 16d) of the recess 17. This way, when the edge-emitting laser diode is activated the light it emits will exit the thermal energy transfer apparatus 5001 by travelling through the slit or opening 15.

In some embodiments, the recess 17 is located relatively closer to the second primary end 12b of the first fin portion 10 than to the first primary end 12a of the first fin portion 10.

In some embodiments, the first fin portion 10 is taller than the second fin portion 20 with respect to the first primary surface 5a of the base portion 5 when the first primary end 12a of the first fin portion 10 and the first primary end 22a of the second fin portion 20 are received by the base portion 5. In some embodiments, the first and second fin portions 10, 20 are in contact when the first and second fin portions 10, 20 are received by the base portion 5. In some embodiments, the first and second fin portions 10, 20 are spaced apart and not in contact when the first and second fin portions 10, 20 are received by the base portion 5.

In some embodiments, the base portion 5 further comprises first and second grooves 7a, 7b each having a generally V-shaped longitudinal cross section such that the first and second fin portions 10, 20 are interlockingly received in the first and second grooves 7a, 7b, respectively. The first primary end 12a of the first fin portion 10 is generally V-shaped and received in the first groove 7a. The first primary end 22a of the second fin portion 20 is generally V-shaped and received in the second groove 7b.

In some embodiments, the thermal energy transfer apparatus 5001 further comprises the heat-generating device 40 received in the recess 17 and between the first fin portion 10 and the second fin portion 20 with at least a portion of an edge along a primary surface of the heat-generating device 40 that is in contact with the first primary surface 16e of the second fin portion 20 exposed by the opening 15 of the first fin portion 10. The heat-generating device 40 may comprise an edge-emitting laser diode with a first primary side that has a light-emitting edge adjacent and in contact with the first primary surface 24a of the second fin portion 20 when the heat-generating device 40 is received in the recess 17.

FIGS. 22-26 illustrate various views of a silicon-based thermal energy transfer apparatus 5002 that aids dissipation of thermal energy from a plurality of heat-generating devices in accordance with another embodiment of the present disclosure.

The thermal energy transfer apparatus 5002 comprises a silicon-based base portion 8 having a first primary surface 8a. The thermal energy transfer apparatus 5002 further comprises a silicon-based support structure 60 having a mounting end and a distal end opposite the mounting end with the mounting end received by the base portion 8 such that the support structure 60 extends from the first primary surface 8a of the base portion 8. The support structure 60 includes a plurality of recesses 77 defined therein to receive a plurality of edge-emitting laser diodes 50. The support structure 60 further includes a plurality of slits each connecting the distal end and a respective one of the recesses 77 to expose at least a portion of a light-emitting edge of a respective one of the edge-emitting laser diodes 50 when the edge-emitting laser diodes 50 are received in the support structure 60.

In some embodiments, a dimension of each the slits that is horizontal with respect to the base portion 8 (e.g., width of the slit) may be less than a dimension of the respective one of the recesses 77 that is horizontal with respect to the base portion 8 (e.g., width of the recess 77).

In some embodiments, each of the recesses 77 is sized and shaped so that the respective one of the edge-emitting laser diodes 50 is tightly received in the recess 77 when the respective edge-emitting laser diode 50 is received in the respective recess 77.

In some embodiments, the support structure 60 comprises a plurality of fin portions 70a-n (any individual one of which will be referred to as "fin portion 70" hereinafter) made of silicon and extending longitudinally from the first primary surface 8a of the base portion 8. Each of at least some of the fin portions 70a-n includes a first primary end 72a received by the base portion 8 and a second primary end 72b opposite to the first primary end 72a of the respective fin portion 70. Each of the at least some of the fin portions 70a-n further includes a first primary surface 74a and a second primary surface 74b opposite to the first primary surface 74a of the respective fin portion 70. The first and second primary surfaces 74a, 74b of each of the at least some of the fin portions 70a-n extend between the first and second primary ends 72a, 72b of the respective fin portion 70. The first primary surface 74a of each of the at least some of the fin portions 70a-n includes a respective recess 77 configured to receive a respective edge-emitting laser diode 50. Each of the at least some of the fin portions 70a-n further includes an opening 75 connecting the respective recess 77 and the respective second primary end 72b of the respective fin portion 70 such that the openings 75 of the at least some of the fin portions 70a-n form the slits when the at least some of the fin portions 70a-n are received by the base portion 8.

In some embodiments, the base portion 8 further comprise a plurality of grooves 9a-n each having a generally V-shaped longitudinal cross section such that the fin portions 70a-n are interlockingly received in the grooves 9a-n, respectively. The first primary end 72a of each of the fin portions 70a-n is generally V-shaped and received in a respective one of the grooves 9a-n.

Each of the fin portions 70a-n of the thermal energy transfer apparatus 5002 may be the same as the first fin portion 10 of the thermal energy transfer apparatus 5001. In the interest of brevity, detailed description of the recess 77 and the opening 75 will not be repeated. The form factor of the recess 77, as with the recess 17, advantageously allows the edge-emitting laser diode 50 to be simply placed in the recess 77 during the assembly process without the need of any alignment of the orientation of the edge-emitting laser diode 50 with respect to the thermal energy transfer apparatus 5002. In other words, the present disclosure allows passive alignment of the edge-emitting laser diodes 50. During assembly each edge-emitting laser diode 50 only needs to be placed in the recess 77 with its light-emitting edge on the side that is in contact with the primary recess surface 16e of the recess 77 and along the upper side (e.g., side 16d) of the recess 77. This way, when each edge-emitting laser diode 50 is activated the light it emits will exit the thermal energy transfer apparatus 5002 by travelling through the respective slit or opening 75.

FIGS. 27-31 illustrate various views of a silicon-based thermal energy transfer apparatus 5003 that aids dissipation of thermal energy from a plurality of heat-generating devices in accordance with another embodiment of the present disclosure.

The thermal energy transfer apparatus 5003 comprises a silicon-based base portion 3 having a first primary surface 3a. The thermal energy transfer apparatus 5003 further comprises a silicon-based support structure 200 having a mounting end and a distal end opposite the mounting end with the mounting end received by the base portion 3 such that the support structure 200 extends from the first primary surface 3a of the base portion 3. The support structure 200 includes a plurality of recesses 97a, 97b defined therein to receive a plurality of edge-emitting laser diodes 50. The support structure 200 further includes a plurality of slits each connecting the distal end and a respective one of the recesses 97a, 97b to expose at least a portion of a light-emitting edge of a respective one of the edge-emitting laser diodes 50 when the edge-emitting laser diodes 50 are received in the support structure 200.

In some embodiments, a dimension of each the slits that is horizontal with respect to the base portion 3 (e.g., width of the slit) may be less than a dimension of the respective one of the recesses 97a, 97b that is horizontal with respect to the base portion 3 (e.g., width of the recess 97a, 97b).

In some embodiments, each of the recesses 97a, 97b is sized and shaped so that the respective one of the edge-emitting laser diodes 50 is tightly received in the recess 97a or 97b when the respective edge-emitting laser diode 50 is received in the respective recess 97a or 97b.

In some embodiments, the support structure 200 comprises a plurality of fin portions 90a, 90b, 90c (any individual one of which will be referred to as "fin portion 90" hereinafter) made of silicon and extending longitudinally from the first primary surface 3a of the base portion 3. Each of at least some of the fin portions 90a-c includes a first primary end 92a received by the base portion 3 and a second primary end 92b opposite to the first primary end 92a of the respective fin portion 90. Each of the at least some of the fin portions 90a-c further includes a first primary surface 94a and a second primary surface 94b opposite to the first primary surface 94a of the respective fin portion 90. The first and second primary surfaces 94a, 94b of each of the at least some of the fin portions 90a-c extend between the first and second primary ends 92a, 92b of the respective fin portion 90. The first primary surface 94a of each of the at least some of the fin portions 90a-c includes two separate recesses 97a and 97b each configured to receive a respective edge-emitting laser diode 50. Each of the at least some of the fin portions 90a-c further includes an opening 95 connecting the respective recess 97a, 97b and the respective second primary end 92b of the respective fin portion 90 such that the openings 95 of the at least some of the fin portions 90a-c form the slits when the at least some of the fin portions 90a-c are received by the base portion 3.

In some embodiments, the base portion 3 further comprise a plurality of grooves 4a, 4b, 4cc each having a generally V-shaped longitudinal cross section such that the fin portions 90a-c are interlockingly received in the grooves 4a-c, respectively. The first primary end 92a of each of the fin portions 90a-c is generally V-shaped and received in a respective one of the grooves 4a-c.

Each of the recesses 97a, 97b of the thermal energy transfer apparatus 5003 is as wide as the recess 17 of the thermal energy transfer apparatus 5001 and each recess 77 of the thermal energy transfer apparatus 5002. Likewise, each of the openings 95 of the thermal energy transfer apparatus 5003 is as wide as the opening 15 of the thermal energy transfer apparatus 5001 and each opening 75 of the thermal energy transfer apparatus 5002. The design of the fin portions 90 allows two edge-emitting laser diodes 50 to be placed next to one another in the respective recess 97a or 97b and separated by a given distance. Accordingly, the silicon-based support structure 200 of the thermal energy transfer apparatus 5003 is configured to hold two stacks of edge-emitting laser diodes 50 in a two-by-two fashion.

The form factor of each of the recesses 97a, 97b, as with the recess 17 and recess 77, advantageously allows an edge-emitting laser diode 50 to be simply placed in each of the recesses 97a, 97b during the assembly process without the need of any alignment of the orientation of the edge-emitting laser diodes 50 with respect to the thermal energy transfer apparatus 5003. In other words, the present disclosure allows passive alignment of the edge-emitting laser diodes 50. During assembly each edge-emitting laser diode 50 only needs to be placed in a respective recess 97a or 97b with its light-emitting edge on the side that is in contact with the primary recess surface of the recess 97a, 97b and along the upper side of the recess 97a, 97b. This way, when each edge-emitting laser diodes 50 is activated the light it emits will exit the thermal energy transfer apparatus 5003 by travelling through the respective slit or opening 95.

FIGS. 32-36 illustrate various views of a silicon-based thermal energy transfer apparatus 5004 that aids dissipation of thermal energy from a plurality of heat-generating devices in accordance with another embodiment of the present disclosure.

The thermal energy transfer apparatus 5004 comprises a silicon-based base portion 2 having a first primary surface 2a. The thermal energy transfer apparatus 5004 further comprises a silicon-based support structure 300 having a mounting end and a distal end opposite the mounting end with the mounting end received by the base portion 2 such that the support structure 300 extends from the first primary surface 2a of the base portion 2. The support structure 300 includes a plurality of recesses 117 defined therein to receive a plurality of edge-emitting laser diodes 50. The support structure 300 further includes a plurality of slits each connecting the distal end and a respective one of the recesses 117 to expose at least a portion of a light-emitting edge of a respective one of the edge-emitting laser diodes 50 when the edge-emitting laser diodes 50 are received in the support structure 300.

In some embodiments, a dimension of each the slits that is horizontal with respect to the base portion 2 (e.g., width of the slit) may be less than a dimension of the respective one of the recesses 117 that is horizontal with respect to the base portion 2 (e.g., width of the recess 117).

In some embodiments, each of the recesses 117 is sized and shaped so that the respective one of the edge-emitting laser diodes 50 is tightly received in the recess 117 when the respective edge-emitting laser diode 50 is received in the respective recess 117.

In some embodiments, the support structure 300 comprises a plurality of fin portions 110a, 110b, 110c (any individual one of which will be referred to as "fin portion 110" hereinafter) made of silicon and extending longitudinally from the first primary surface 2a of the base portion 2. Each of at least some of the fin portions 110a-c includes a first primary end 112a received by the base portion 2 and a second primary end 112b opposite to the first primary end 112a of the respective fin portion 110. Each of the at least some of the fin portions 110a-c further includes a first primary surface 114a and a second primary surface 114b opposite to the first primary surface 114a of the respective fin portion 110. The first and second primary surfaces 114a, 114b of each of the at least some of the fin portions 110a-c extend between the first and second primary ends 112a, 112b of the respective fin portion 110. The first primary surface 114a of each of the at least some of the fin portions 90a-c includes two separate recesses 117a and 117b each configured to receive a respective edge-emitting laser diode 50. Each of the at least some of the fin portions 110a-c further includes an opening 115 connecting the respective recess 117 and the respective second primary end 112b of the respective fin portion 110 such that the openings 115 of the at least some of the fin portions 110a-c form the slits when the at least some of the fin portions 110a-c are received by the base portion 2.

In some embodiments, the base portion 2 further comprise a plurality of grooves 6a, 6b, 6c each having a generally V-shaped longitudinal cross section such that the fin portions 110a-c are interlockingly received in the grooves 6a-c, respectively. The first primary end 112a of each of the fin portions 110a-c is generally V-shaped and received in a respective one of the grooves 6a-c.

Each of the recesses 117 of the thermal energy transfer apparatus 5004 is twice as wide as the recess 17 of the thermal energy transfer apparatus 5001, twice as wide as each recess 77 of the thermal energy transfer apparatus 5002, and twice as wide as each recess 97a, 97b of the thermal energy transfer apparatus 5003. Likewise, each of the openings 115 of the thermal energy transfer apparatus 5004 is at least twice as wide as the opening 15 of the thermal energy transfer apparatus 5001, at least twice as wide as each opening 75 of the thermal energy transfer apparatus 5002, and at least twice as wide as each opening 95 of the thermal energy transfer apparatus 5003. This allows two edge-emitting laser diodes 50 to be placed side-by-side in each recess 117. Accordingly, the silicon-based support structure 300 of the thermal energy transfer apparatus 5004 is configured to hold two stacks of edge-emitting laser diodes 50 in a two-by-two fashion. Every two adjacent edge-emitting laser diodes 50 in the same recess 117 are in contact with each other by a respective edge.

The form factor of each of the recesses 117, as with the recess 17 and recess 77, advantageously allows an edge-emitting laser diode 50 to be simply placed in each of the recesses 117 during the assembly process without the need of any alignment of the orientation of the edge-emitting laser diodes 50 with respect to the thermal energy transfer apparatus 5004. In other words, the present disclosure allows passive alignment of the edge-emitting laser diodes 50. During assembly each edge-emitting laser diode 50 only needs to be placed in a respective recess 117 with its light-emitting edge on the side that is in contact with the primary recess surface of the recess 117 and along the upper side of the recess 117. This way, when each edge-emitting laser diodes 50 is activated the light it emits will exit the thermal energy transfer apparatus 5004 by travelling through the respective slit or opening 115.

CONCLUSION

The above-described techniques pertain to passive alignment of a heat-generating device that is being cooled by a silicon-based thermal energy transfer apparatus. Although the techniques have been described in language specific to certain applications, it is to be understood that the appended claims are not necessarily limited to the specific features or applications described herein. Rather, the specific features and applications are disclosed as exemplary forms of implementing such techniques. For instance, although the techniques have been described in the context of passive alignment of a laser diode, the techniques may be applied in any other suitable context.

What is claimed is:

1. A silicon-based thermal energy transfer apparatus that aids dissipation of thermal energy from a heat-generating device, the apparatus comprising:
   a base portion made of silicon and having a first primary surface, the first primary surface including at least first and second V-notch grooves thereon; and
   a support portion made of silicon and having at least first and second V shaped wedges that are interlockingly received in the first and second V-notch grooves when the support portion is mounted on the base portion with two surfaces of the first V-shaped wedge mating two surfaces of the first V-notch groove and two surfaces of the second V-shaped wedge mating two surfaces of the second V-notch groove.

2. The apparatus of claim 1, wherein the support portion comprises:
   first and second fin portions made of silicon and extending longitudinally from the first primary surface of the base portion,
   wherein:
   the first fin portion includes a first primary end received by the base portion and a second primary end opposite the first primary end of the first fin portion, the first fin portion further includes a first primary surface facing the second fin portion and a second primary surface opposite the first primary surface of the first fin portion, the first and second primary surfaces of the first fin portion extend between the first and second primary ends of the first fin portion, the second fin portion includes a first primary end received by the base portion and a second primary end opposite the first primary end of the second fin portion, the second fin portion further includes a first primary surface facing the first fin portion and a second primary surface opposite the first primary surface of the second fin portion, the first and second primary surfaces of the second fin portion extend between the first and second primary ends of the second fin portion, the first primary surface of the first fin portion includes a recess configured to receive the heat-generating device, the recess includes a primary recess surface that is generally parallel to the first primary surface of the first fin portion, the first fin portion further includes an opening between the recess and the second primary end of the first fin portion such that the primary recess surface extends to the second primary end of the first fin portion.

3. The apparatus of claim 2, wherein a dimension of the opening that is horizontal with respect to the base portion is less than a dimension of the recess that is horizontal with respect to the base portion.

4. The apparatus of claim 2, wherein the recess is sized and shaped to have at least two dimensions of the recess along the primary recess surface matching corresponding dimensions of the heat-generating device so that the heat-generating device is tightly received in the recess when the heat-generating device is received in the recess.

5. The apparatus of claim 2, wherein the recess is relatively closer to the first primary end of the first fin portion than to the second primary end of the first fin portion.

6. The apparatus of claim 2, wherein the first fin portion is taller than the second fin portion with respect to the first primary surface of the base portion when the first primary end of the first fin portion and the first primary end of the second fin portion are received by the base portion.

7. The apparatus of claim 2, wherein the first and second fin portions are in contact when the first and second fin portions are received by the base portion.

8. The apparatus of claim 1, wherein at least one of the base portion and the support portion is made of single-crystal silicon.

9. The apparatus of claim 2, further comprising:
the heat-generating device received in the recess and between the first fin portion and the second fin portion with at least a portion of an edge along a primary surface of the heat-generating device that is in contact with the first primary surface of the second fin portion exposed by the opening of the first fin portion.

10. The apparatus of claim 9, wherein the heat-generating device comprises an edge-emitting laser diode with a first primary side that has a light-emitting edge adjacent and in contact with the first primary surface of the second fin portion when the heat-generating device is received in the recess.

11. A silicon-based thermal energy transfer apparatus that aids dissipation of thermal energy from edge-emitting laser diodes, the apparatus comprising:
a base portion made of silicon and having a first primary surface, the first primary surface including at least first and second V-notch grooves thereon; and
a support portion made of silicon and having a mounting end and a distal end opposite the mounting end, the mounting end having at least first and second edges that are interlockingly received in the first and second V-notch grooves when the support portion is mounted on the base portion, the support structure including a recess configured to receive an edge-emitting laser diode, the support structure further including a slit connecting the distal end and the recess to expose at least a portion of the light-emitting edge of the edge-emitting laser diode when the edge-emitting laser diode is received in the support structure.

12. The apparatus of claim 11, wherein a dimension of each the slits that is horizontal with respect to the base portion is less than a dimension of the respective one of the recesses that is horizontal with respect to the base portion.

13. The apparatus of claim 11, wherein the support structure comprises:
first and second fin portions made of silicon and extending longitudinally from the first primary surface of the base portion:
the first fin portion having a first primary end received by the base portion and a second primary end opposite the first primary end of the first fin portion, the first fin portion further having a first primary surface facing the second fin portion and a second primary surface opposite the first primary surface of the first fin portion, the first and second primary surfaces of the first fin portion extending between the first and second primary ends of the first fin portion;

the second fin portion having a first primary end received by the base portion and a second primary end opposite the first primary end of the second fin portion, the second fin portion further having a first primary surface facing the first fin portion and a second primary surface opposite the first primary surface of the second fin portion, the first and second primary surfaces of the second fin portion extending between the first and second primary ends of the second fin portion; and the first primary surface of the first fin portion including the recess configured to receive the edge-emitting laser diode, the recess having a primary recess surface that is generally parallel to the first primary surface of the first fin portion, the first fin portion further having an opening between the recess and the second primary end of the first fin portion such that the primary recess surface extends to the second primary end of the first fin portion.

14. The apparatus of claim 11, further comprising:
a cylindrical-shaped collimating lens disposed on the distal end of the support structure.

* * * * *